United States Patent
Dobashi et al.

(10) Patent No.: US 11,694,872 B2
(45) Date of Patent: Jul. 4, 2023

(54) PATTERN ENHANCEMENT USING A GAS CLUSTER ION BEAM

(71) Applicant: TEL Manufacturing and Engineering of America, Inc., Chaska, MN (US)

(72) Inventors: Kazuya Dobashi, Hillsboro, OR (US); Hiromitsu Kambara, Miyagi (JP); Masaru Nishino, Hillsboro, OR (US); Reo Kosaka, Miyagi (JP); Matthew Gwinn, Billerica, MA (US); Luis Fernandez, Billerica, MA (US); Kenichi Oyama, Yamanashi (JP); Sakurako Natori, Yamanashi (JP); Noriaki Okabe, Tokyo (JP)

(73) Assignee: TEL Manufacturing and Engineering of America, Inc., Chaska, MN (US)

( * ) Notice: Subject to any disclaimer, the term of this patent is extended or adjusted under 35 U.S.C. 154(b) by 0 days.

(21) Appl. No.: 17/663,811

(22) Filed: May 17, 2022

(65) Prior Publication Data
US 2022/0277924 A1    Sep. 1, 2022

Related U.S. Application Data

(63) Continuation of application No. 17/018,741, filed on Sep. 11, 2020, now Pat. No. 11,450,506.
(Continued)

(51) Int. Cl.
*H01J 37/20*  (2006.01)
*H01J 37/317*  (2006.01)
(Continued)

(52) U.S. Cl.
CPC .............. *H01J 37/20* (2013.01); *C23C 14/46* (2013.01); *C23C 14/505* (2013.01);
(Continued)

(58) Field of Classification Search
CPC . H01J 37/20; H01J 37/217; H01J 2237/20228
See application file for complete search history.

(56) References Cited

U.S. PATENT DOCUMENTS 5,459,326 A * 10/1995 Yamada ............ H01L 21/26513
250/398
5,814,194 A *  9/1998 Deguchi ................. C30B 33/00
427/249.8

(Continued)

OTHER PUBLICATIONS

Internet Archive Wayback Machine, "Gas Cluster Ion Beam System UltraTrimmer Series," https://web.archive.org/web/20180313021429/ https://www.tel.com/product/ultratrimmer.html, Mar. 13, 2018, 3 pages.

(Continued)

*Primary Examiner* — David A Vanore
(74) *Attorney, Agent, or Firm* — Slater Matsil, LLP

(57) ABSTRACT

A method of processing a substrate includes loading the substrate on a substrate holder. The substrate includes a major surface and a feature disposed over the major surface. The feature has a first width along an etch direction. The method includes exposing portions of the major surface and changing the first width of the feature to a second width along the etch direction by etching a first portion of the sidewalls of the feature with a gas cluster ion beam oriented along a beam direction.

22 Claims, 10 Drawing Sheets

Related U.S. Application Data

(60) Provisional application No. 63/015,157, filed on Apr. 24, 2020.

(51) Int. Cl.
  *C23C 14/46* (2006.01)
  *C23C 14/50* (2006.01)
  *H01L 21/68* (2006.01)

(52) U.S. Cl.
  CPC ............ *H01J 37/317* (2013.01); *H01L 21/68* (2013.01); *H01J 2237/20228* (2013.01)

(56) References Cited

U.S. PATENT DOCUMENTS

| | | | |
|---|---|---|---|
| 6,207,282 B1 | 3/2001 | Deguchi et al. | |
| 6,797,334 B2 | 9/2004 | Akizuki et al. | |
| 6,797,339 B2 | 9/2004 | Akizuki et al. | |
| 7,608,843 B2 | 10/2009 | Freytsis et al. | |
| 8,088,685 B2* | 1/2012 | Lin | H01L 21/28079 |
| | | | 257/E21.585 |
| 8,791,430 B2 | 7/2014 | Gwinn et al. | |
| 9,530,665 B2* | 12/2016 | Leobandung | H01L 27/1211 |
| 9,748,392 B1* | 8/2017 | Wang | H01L 29/4966 |
| 10,916,472 B2* | 2/2021 | Clark | H01L 21/76802 |
| 11,101,173 B2* | 8/2021 | Clark | H01L 21/31116 |
| 2011/0212592 A1* | 9/2011 | Nieh | H01L 21/26513 |
| | | | 438/306 |
| 2012/0223249 A1* | 9/2012 | Gwinn | H01J 37/20 |
| | | | 250/453.11 |
| 2013/0059449 A1* | 3/2013 | Hautala | H01L 21/32136 |
| | | | 438/714 |
| 2013/0248355 A1* | 9/2013 | Ohsawa | H01L 43/10 |
| | | | 204/192.34 |
| 2015/0027501 A1* | 1/2015 | Dobashi | H01L 21/02046 |
| | | | 15/303 |
| 2015/0200276 A1* | 7/2015 | Cheng | H01L 29/785 |
| | | | 438/283 |
| 2015/0251913 A1* | 9/2015 | Matsumoto | H01J 37/3178 |
| | | | 204/192.34 |
| 2016/0001334 A1* | 1/2016 | Dobashi | B08B 5/02 |
| | | | 134/1 |
| 2016/0064239 A1* | 3/2016 | Shih | H01L 21/0273 |
| | | | 438/694 |
| 2017/0207076 A1* | 7/2017 | Dobashi | H01L 21/67196 |
| 2018/0299771 A1* | 10/2018 | Kirkpatrick | H01L 21/26513 |
| 2021/0107041 A1* | 4/2021 | Dobashi | H01L 21/67028 |

OTHER PUBLICATIONS

Ruffell, Simon et al., "Directed ribbon-beam capability for novel etching applications," Journal of Vacuum Science & Technology, B 33, Sep. 2015, 6 pages.

Wikipedia, "GCIB-wiki Gas cluster ion beam," Aug. 12, 2008, 4 pages.

* cited by examiner

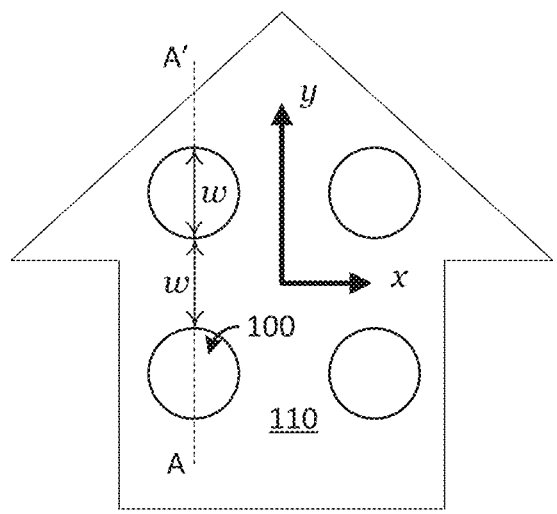
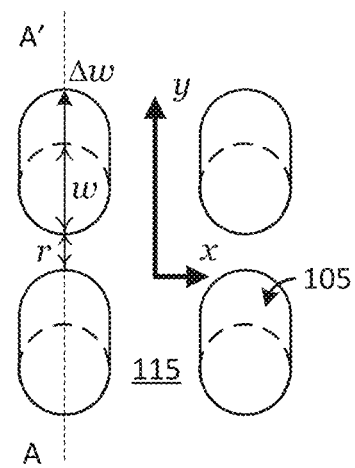
Figure 1A                              Figure 1B
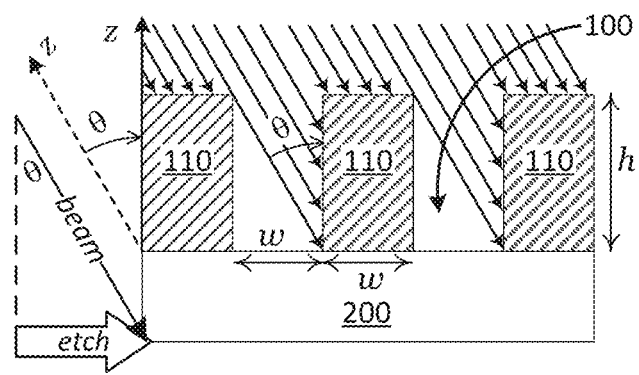
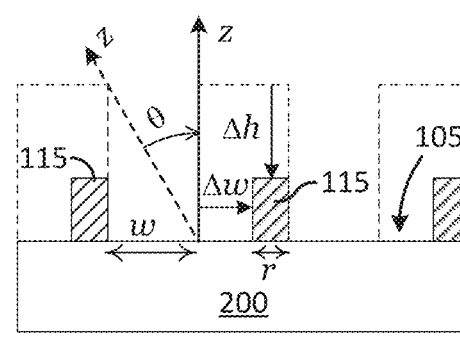
Figure 2A                              Figure 2B
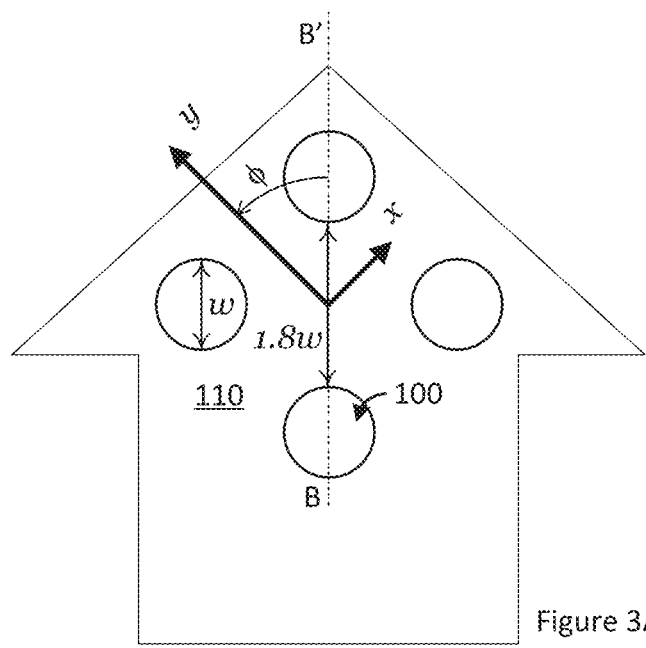
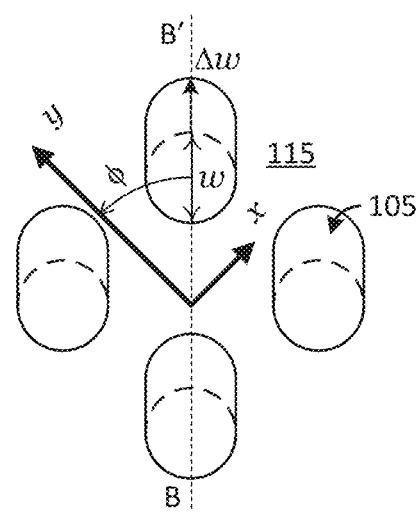
Figure 3A                              Figure 3B

PATTERN ENHANCEMENT USING A GAS CLUSTER ION BEAM

CROSS-REFERENCE TO RELATED APPLICATIONS

This application is a continuation of U.S. patent application Ser. No. 17/018,741, filed on Sep. 11, 2020, which claims the benefit of U.S. Provisional Application No. 63/015,157, filed on Apr. 24, 2020, which applications are hereby incorporated herein by their reference.

TECHNICAL FIELD

The present invention relates generally to fabricating patterned layers, and, in particular embodiments, to pattern enhancement using a gas cluster ion beam (GCIB).

BACKGROUND

Generally, a semiconductor device, such as an integrated circuit (IC) is fabricated by sequentially depositing and patterning layers of dielectric, conductive, and semiconductor materials over a semiconductor substrate to form a network of electronic components and interconnect elements (e.g., transistors, resistors, capacitors, metal lines, contacts, and vias) integrated in a monolithic structure. At each successive technology node, the minimum feature sizes are shrunk to reduce cost by roughly doubling the component packing density.

A common patterning method is to use a photolithography process to expose a coating of photoresist over the target layer to a pattern of actinic radiation and then transfer the relief pattern to the target layer or an underlying hard mask layer formed over the target layer. With this technique, the minimum feature size for a manufacturable process would be limited by the resolution of the optical system. Deep ultraviolet (DUV) 193 nm immersion photolithography systems can print feature sizes down to about 40 nm. Sub-resolution features may be formed using multiple patterning techniques. For example, with double patterning, DUV 193 nm immersion photolithography has been used to fabricate patterned layers at the 14 nm technology node with features at about 38 nm pitch, but at a higher cost per wafer due to the extra processing steps used in multiple patterning. Further scaling of feature sizes for the 7 nm and 5 nm technology nodes may need 13.5 nm extreme ultraviolet (EUV) photolithography. Stochastic effects resulting from the high energy of EUV photons exacerbate the line edge roughness (LER) and line width roughness (LWR) of photoresist patterns, making high fidelity pattern transfer a challenging task. Innovations may be needed that enhance the pattern quality of patterned layers comprising nanoscale features and lower the cost of patterning.

SUMMARY

In accordance with an embodiment of the present disclosure, a method of processing a substrate includes loading the substrate on a substrate holder. The substrate includes a major surface and a feature disposed over the major surface. The feature has a first width along an etch direction. The method includes exposing portions of the major surface and changing the first width of the feature to a second width along the etch direction by etching a first portion of the sidewalls of the feature with a gas cluster ion beam oriented along a beam direction.

In accordance with an embodiment of the present disclosure, a method of processing a substrate includes loading the substrate on a substrate holder, the substrate including a major surface and a plurality of parallel lines disposed over the major surface; and exposing the plurality of parallel lines to a gas cluster ion beam oriented in a beam direction, the beam direction having an orthogonal projection onto the major surface, the orthogonal projection being oriented in an etch direction, wherein the plurality of parallel lines are parallel with the etch direction.

In accordance with an embodiment of the present disclosure, a method of processing a substrate includes loading the substrate on a substrate holder, the substrate including a major surface, a first feature disposed over the major surface at a first location, and a second feature disposed over the major surface at a second location; exposing the first feature to a first gas cluster ion beam with a first process parameter; and exposing the second feature to a second gas cluster ion beam with a second process parameter, the first process parameter being different from the second process parameter.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A and 1B illustrate planar views of a substrate at various intermediate stages of a gas cluster ion beam pattern enhancement process, in accordance with an embodiment;

FIGS. 2A and 2B illustrate cross-sectional views of a substrate at various intermediate stages of the gas cluster ion beam pattern enhancement process, shown in the planar views illustrated in FIGS. 1A and 1B;

FIGS. 3A and 3B illustrate planar views of a substrate at various intermediate stages of a gas cluster ion beam pattern enhancement process, in accordance with various embodiments;

FIGS. 3C and 3D illustrate the GCIB edge-displacement etch being used to change the width of a construct within a patterned layer, wherein FIG. 3C shows the gas cluster ion beam incident on the substrate tilted by a tilt angle, and wherein FIG. 3D illustrates the patterned layer formed by exposing the initial pattern to the gas cluster ion beam;

DETAILED DESCRIPTION OF ILLUSTRATIVE EMBODIMENTS

Figure 3C:
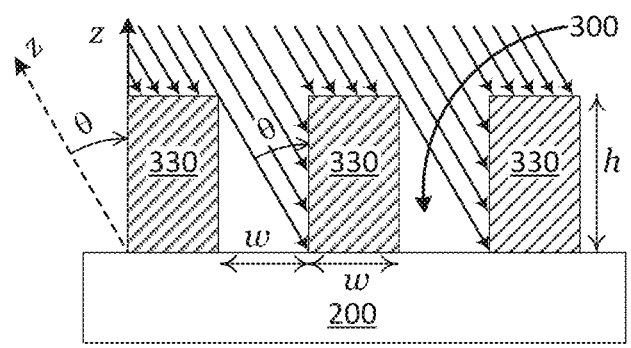

This disclosure describes methods for enhancing a patterned layer by making fine adjustments to patterned features of the layer using a gas cluster ion beam (GCIB). The disclosed processes may be advantageous for the manufacturing of semiconductor integrated circuits that comprise patterned layers designed using nanometer scale features by improving pattern quality with minimal additional processing.

GCIB processing is a technique for controllable nanoscale processing of a surface by exposing the surface to a highly collimated beam of high energy clustered ions. Clusters of atoms or molecules of various sizes, loosely bound by van der Waals forces, may be formed by condensation induced by adiabatic expansion of a gas; for example, by releasing compressed gas (e.g., at about $10^4$ Torr) to a vacuum (e.g., about $10^{-2}$ Torr) using a supersonic nozzle. A jet of nanometer size clusters emanating from the nozzle may pass through apertures into an ionizer in high vacuum (e.g., about $10^{-5}$ Torr) where the clusters are ionized by colliding with energetic electrons to acquire an average positive charge of a about +1e to +10e per cluster, where e is electron charge. The ion clusters may then be accelerated by a voltage drop of 10 kV to about 60 kV, and collimated and directed by electromagnetic lenses to impinge on the surface to be processed. The spot size of a gas cluster ion beam may vary from a few microns to a few centimeters. In the embodiments of GCIB processes in this disclosure, the spot sizes may be about 1 cm to about 10 cm in diameter. A Wien filter may be used to select a range of cluster sizes; for example, from about 1000 atoms or molecules to about 10,000 atoms or molecules. In various semiconductor processing applications, the gas cluster ion beam may comprise inert gases such as nitrogen and argon, or reactants such as $O_2$, $CO_2$, $NH_3$, $NF_3$, $SF_6$, $CF_4$, $CHF_3$, or the like, or a mixture of several gases. Upon striking a surface, the cluster disintegrates and delivers most of its energy toward modifying the substrate physically and/or chemically. Although each cluster has high energy (e.g., about 30 keV to 80 keV), the energy per atom (or molecule) is low; the atoms (or molecules) are generally stopped within about a few nanometers (e.g., 10 nm to about 15 nm) from the surface. The cluster structure is thus exploited to deliver a high energy density locally for close to ideal surface processing. Generally, a GCIB process may be performed with a total dose of about $10^{11}$ cluster impacts/cm$^2$ to about $10^{16}$ cluster impacts/cm$^2$. Furthermore, a low charge to mass ratio of clusters allows for GCIB processing with a low beam current (e.g., about 0.5 mA to about 0.15 mA). The low beam current provides the advantages of avoiding undesirable surface charging and substrate heating by keeping the average power to be less than about 1 W to about 5 W for the embodiments described in this disclosure.

Embodiments of GCIB processes are disclosed that may be used to edit features within a patterned layer to provide feature sizes smaller than the resolution limit of the photo-lithography system used to form the initial pattern. The sub-resolution features may be created by displacing the patterned edges of features with a gas cluster ion beam. The GCIB processes described in this disclosure provide the advantage of printing features with sub-resolution dimensions at a cost lower than the cost of using, for example, a litho-etch-litho-etch (LELE) double patterning technique. Example embodiments of methods for processing a patterned layer on a substrate to alter the shape of features within the patterned layer is described in detail further below with reference to FIGS. 1A through 4. Three different execution flow options using GCIB edge-displacement etch for obtaining the same target pattern in a target layer is illustrated below with reference to FIG. 5.

Random variations in critical dimensions in a pattern result from surface roughness of sidewalls along the edges of features, such as lines, trenches, pillars, and holes within a patterned layer. Embodiments of GCIB processes will be described that enhance a patterned layer by smoothing the surfaces of features by trimming random protrusions from exposed surfaces using a gas cluster ion beam. A GCIB trim etch process may also be applied to descum a patterned layer. Example embodiments of GCIB trim etch processes are described in detail further below with reference to FIGS. 6 through 9.

Methods to enhance a pattern by reducing variability of a critical dimension using location specific edge-correction processing with a gas cluster ion beam have been provided. Systematic variations in patterned dimensions from the respective target dimensions are often location specific. For example, a spatially nonuniform gas flow pattern of a reactant gas in a process chamber during an etch process may cause a critical dimension in a patterned layer to be systematically larger than target, for example, in a region closer to the edge of the substrate. In the embodiments of location specific processing (LSP) methods described in this disclosure, an adaptive GCIB process is used, wherein the process is dynamically altered in accordance with the location of the substrate as the substrate is moved through a gas cluster ion beam. Embodiments of GCIB-LSP techniques are described in detail further below with reference to FIGS. 10 and 11.

The processing system, in which the GCIB processes described in this disclosure may be performed, comprises a processing chamber coupled to a GCIB source and a scanning apparatus. The processing may be controlled by, for example, a programmable electronic controller. An example of a GCIB processing system and various orientations in which the substrate may be positioned relative to the gas cluster ion beam are described further below with reference to FIGS. 12A through 14C and is described in further detail in U.S. Provisional Application No. 63/15,157.

FIG. 1A illustrates a planar view of a rectangular array of roughly circular openings 100 having a width w in a patterned layer no. The array of circular openings 100 may be edited using a gas cluster ion beam to form a respective array of roughly oval shaped openings 105, shown in FIG. 1B. The cross-sectional views, corresponding to the planar views in FIGS. 1A and 1B, are shown in FIGS. 2A and 2B, respectively, along a cut-plane indicated by a dashed line A-A' in FIGS. 1A and 1B. As illustrated in FIG. 2A, the openings wo may be holes extending vertically to expose portions of a roughly planar major surface of a substrate 200 over which the patterned layer has been formed. The patterned layer no may comprise, for example, photoresist and the substrate 200 may comprise a layer of stacked layers, the major surface being, for example, a top surface of a silicon-containing antireflective coating (SiARC).

In the figures in this disclosure, the x and y axes represent reference directions in the plane of the substrate and the z-axis represent the normal to the surface, also referred to as the major surface of the substrate. For the examples in this disclosure, the substrate 200 is a semiconductor substrate (e.g., a silicon substrate). The origin of the x-y-z rectangular system is selected to be at the center of the top surface (the major surface) of the semiconductor substrate, and the y-axis is selected to be a line going through the center and a notch made in the initial semiconductor wafer over which the subsequent layers of the substrate 200 have been formed. The dimensions of patterned features (e.g., the width w) are defined and measured in the x-y plane. The orientations of the patterned features, such as the orientation of word lines relative to the orientation of bit lines in a memory array, also refer to the x and y axes. The substrate holder on which the substrate is loaded is in a plane parallel to the major surface of the substrate separated by the wafer thickness. During processing, the scanning apparatus of the GCIB system used in the embodiments in this disclosure moves the substrate and the substrate holder through a gas cluster ion beam along a scan trajectory in the x-y plane, as described in U.S. Provisional Application No. 63/15,157.

In the embodiments described in this disclosure, the gas cluster ion beam of the GCIB processing system remains fixed while the substrate is moved using a scanning apparatus. For specificity, consider a horizontal gas cluster ion beam oriented in a direction, referred to as the beam direction. If the GCIB process is to be used to change the width of a feature then the major surface of the substrate has to be tilted relative to the beam direction; a vertically incident gas cluster ion beam would not be effective in altering a dimension along a direction in the plane of the major surface. Thus, prior to scanning through the gas cluster ion beam, the scanning apparatus may adjust the orientation of the substrate relative to the gas cluster ion beam by rotating a substrate holder on which the substrate is placed.

The tilt of the substrate is quantified by the angle between the z-axis and the beam direction, referred to as a tilt angle, θ, where vertical incidence is defined to be θ=0°. In this disclosure, the tilt angle (θ) is set by rotating the substrate holder (and the substrate) using a circular rotatable feedthrough connecting a scanner chamber and a process chamber, as described in U.S. Provisional Application No. 63/15, 157 and also further below with reference to FIG. 12B, FIG. 13, and FIGS. 14A-14C. The axis about which the substrate is rotated to set θ is the central axis of the circular rotatable feedthrough and is designed such that the axis of rotation is perpendicular to the beam direction.

In the example illustrated in FIG. 2A, the substrate 200 has been tilted relative to the beam direction. Initially, the z-axis of the substrate 200 may be in the direction of the dashed arrow. The gas cluster ion beam (indicated by parallel arrows) would then be normal to the major surface of the substrate 200 (tilt angle=o °). A clockwise rotation of the substrate holder through an angle θ tilts the substrate 200 relative to the beam direction. As illustrated in FIG. 2A, the rotation results in the normal to the surface (the z-axis indicated by the solid arrow) and the gas cluster ion beam to form an angle θ=0°. The gas cluster ion beam now strikes one side and top surface of the patterned layer and start removing material from these surfaces, thereby displacing the edge of the etched sidewall along a direction in the x-y plane, referred to as the etch direction. In FIGS. 1A and 2A, the etch direction is indicated by wide arrows. As illustrated in FIG. 2A, the etch direction is the direction of the orthogonal projection of the beam direction onto the tilted x-y plane. In FIG. 1A, the etch direction (or the orthogonal projection of the beam direction) and the y-direction are coincident. As explained in U.S. Provisional Application No. 63/15,157 and also further below, the substrate may be rotated about the z-axis to adjust the angular position of the notch, thereby setting the y-direction as desired.

The example embodiments use a minimum tilt angle of 10° and a maximum tilt angle of 85° (in either positive or negative directions) although the scanning apparatus may rotate the substrate holder a tilt angle over a range −90°≤θ≤90°. One exemplary embodiment may use a minimum tilt angle of 10° and a maximum tilt angle of 65° (in either positive or negative directions) although the scanning apparatus may rotate the substrate holder a tilt angle over a range −90°≤θ≤90°.

In FIGS. 1A and 2A, the patterned layer 110 comprising photoresist is being exposed to a gas cluster ion beam comprising oxygen clusters. The openings 100 are circular holes with a width w along the y-direction of about 10 nm to about 50 nm exposing a SiARC major surface of the substrate 200. Oxygen clusters may etch photoresist at the top surface and the exposed portions of the sidewalls of the openings 100 of the patterned layer 110 with high selectivity to the SiARC major surface of the substrate 200. In this embodiment, the GCIB etch process may be primarily a directional chemical etch, similar to a reactive ion etch (RIE) process. The etch rate is roughly directly proportional to the average flux density of reactants impinging on the surface, for example, the average number of oxygen cluster impacts per unit time per unit area of the surface, in this example embodiment. Accordingly, the photoresist at the top surface would be etched at a rate roughly proportional to the z-component of the cluster-flux density of the gas cluster ion beam (or, ∝ cos (θ)), while the etch rate at the sidewall (which is perpendicular to the top surface) would be roughly proportional to the orthogonal projection of the cluster flux density onto the x-y plane (or, ∝ sin (θ)). For example, at vertical incidence, or θ=0°, sin (θ)=0; the etch rate at the sidewall is zero, but the top surface gets etched (cos(0°)=1). As θ is increased, the sidewalls etch at an increased rate, and the edge of the opening 100 may be displaced along the etch direction (the direction parallel with the orthogonal projection of the gas cluster ion beam), which is the y-direction, in this example.

As mentioned above, the objective of the GCIB etch process in this embodiment is to increase the width, w, of the circular openings 100 in the patterned layer 110 (illustrated in FIG. 1A) by Δw along the y-direction to form the patterned layer 115 comprising oval-shaped openings 105 having a width (w+Δw) in the y-direction, as illustrated in FIG. 1B. In order to etch the sidewall uniformly from the top of the opening 100 to the bottom, the gas cluster ion beam has to access the major surface at the bottom of the patterned layer 110 comprising photoresist of height, h, as illustrated in FIG. 2A. This constrains the tilt angle, θ, to the range $0<\theta<\tan^{-1}$ (w/h), as may be seen from the cross-sectional view in FIG. 2A. Because the top surface is exposed, some photoresist is removed from the top surface. As illustrated in FIG. 2B, at the completion of the GCIB etch process, the height of the patterned layer 115 has reduced by an amount Δh. Loss of photoresist thickness limits its usefulness as an etch mask in a subsequent etch step used transfer the pattern from the patterned layer 115 to an underlying layer. In order to keep Δh small, a high tilt angle, θ, may be selected for which the constraint $0<\theta<\tan^{-1}$ (w/h) can be maintained after accounting for the process control capability of the scanning apparatus.

The GCIB etch removes a portion of the photoresist between adjacent openings along the y-direction to form the stretched openings 105. This process simultaneously reduces the dimension of the photoresist between adjacent openings along the y-direction by Δw, as illustrated in FIGS. 1B and 2B. In some embodiment, the reduced dimension, r, of this photoresist feature may be less than the resolution limit of the photolithography system used to form the patterned layer no. The GCIB process used to form the sub-resolution features in the patterned layer 115 provides the advantage of lower cost relative to using, for example, a more expensive double patterning technique, such as LELE, to form the final pattern 115.

In this example embodiment the patterned layer 100 is a patterned photoresist layer but, it is understood that in various other embodiments, the patterned layer 100 may be a hard mask layer such as, spin-on carbon, or silicon oxide, or silicon nitride, or titanium nitride, or a metal, or a metal oxide, or a combination thereof. Several such options are illustrated further below with reference to FIG. 5.

Although the gas cluster ion beam is fixed, the directional GCIB etch may be performed in any desired direction in the pattern by rotating the substrate 200, or equivalently, rotating the x-y axes about the z-axis by an angle, ϕ, referred to as the twist angle. For example, in FIGS. 3A and 3B, substrate 200 has been rotated by (I)=45° relative to the orientation ϕ=0°, shown in FIGS. 1A and 1B. It is noted that the orientation ϕ=0° has been selected as the orientation for which the y-axis is coincident with the etch direction (the direction along which the GCIB etch would be progressing). Since the direction of the gas cluster ion beam is fixed, the etch direction is always the direction of an orthogonal projection of the gas cluster ion beam onto the plane of the substrate. In FIGS. 3A and 3B, the substrate (and the pattern along with the substrate) has been rotated by ϕ=45°. Accordingly, the y-axis, as shown in FIGS. 3A and 3B, is no longer parallel with the etch direction, indicated by a dashed line B-B' in FIGS. 3A and 3B and the wide arrow in FIG. 3A. Instead, the y-axis and the line B-B' form the angle, (I)=45°, as illustrated in FIGS. 3A and 3B. For ϕ=45°, the distance between adjacent openings 100 along the direction of the projected gas cluster ion beam in FIG. 3A is about 1.8×w if the respective distance in FIG. 1A is equal to the width of the openings, w. FIG. 3B illustrates the patterned layer 115 with the oval shaped openings 105 after the GCIB etch process is completed. Exposure to the gas cluster ion beam changes the circular openings 100 of width, w, to the oval shaped openings 105 of width (w+Δw) along the etch direction, indicated by a dashed line B-B' that is shown forming an angle ϕ=45° with the y-axis in FIGS. 3A and 3B. Since the only difference between the GCIB edge-displacement etch process in FIGS. 1A and 1B and the GCIB edge-displacement etch process in FIGS. 3A and 3B is the change in the twist angle from ϕ=0° to ϕ=45°, the edge displacement, Δw, remains the same.

Figure 3D:
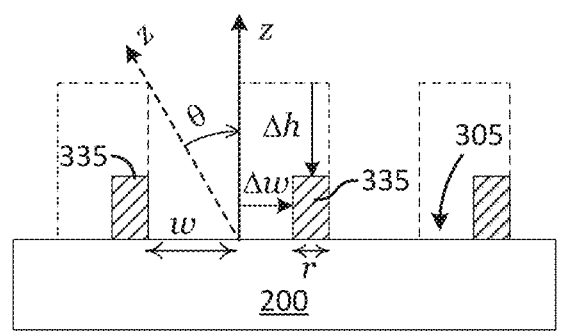

FIGS. 3C and 3D illustrate the GCIB edge-displacement etch being used to change the width of a construct within a patterned layer 330. Features such as lines and pillars are referred to as constructs, whereas trenches and holes are referred to as openings. A construct in a patterned layer is separated from adjacent constructs by a cavity in the layer. The previous two examples, illustrated using FIGS. 1A through 3B, were applications of a GCIB etch process used to elongate holes in two different directions in a patterned array of circular holes. FIGS. 3C and 3D illustrate the same GCIB etch process applied to shrink pillars in a patterned layer 330 comprising an array of circular pillars spaced by cavities in the patterned layer such as cavity 300. FIG. 3C shows the gas cluster ion beam incident on the substrate 200 tilted by a tilt angle, θ. The pillars in the initial patterned layer 330 are of width w, and are spaced from adjacent pillars by a distance w along the etch direction.

FIG. 3D illustrates the patterned layer 335 formed by exposing the initial pattern 330 to the gas cluster ion beam. In FIG. 3D, the initial width w of the pillars is reduced by a length, Δw, along the etch direction. The respective space between adjacent pillars, which is the cavity 305, is wider than the initial cavity 300 by the same length, Δw.

In the above examples of the edge-displacement etches, the width of a feature has been adjusted by etching in a direction defined by a first twist angle, $\phi_1$. However, it is understood that in other embodiments the width of the same feature may be adjusted from the opposite direction. The etching in the opposite direction is performing the same etch process, but selecting a second twist angle, $\phi_2$, where $\phi_2=\phi_1+180°$. Both the GCIB etches may be performed successively on the same substrate, and the respective adjustments, Δw, to the width, w, may be selected to be different, for example, by selecting different GCIB exposure doses.

Figure 4:
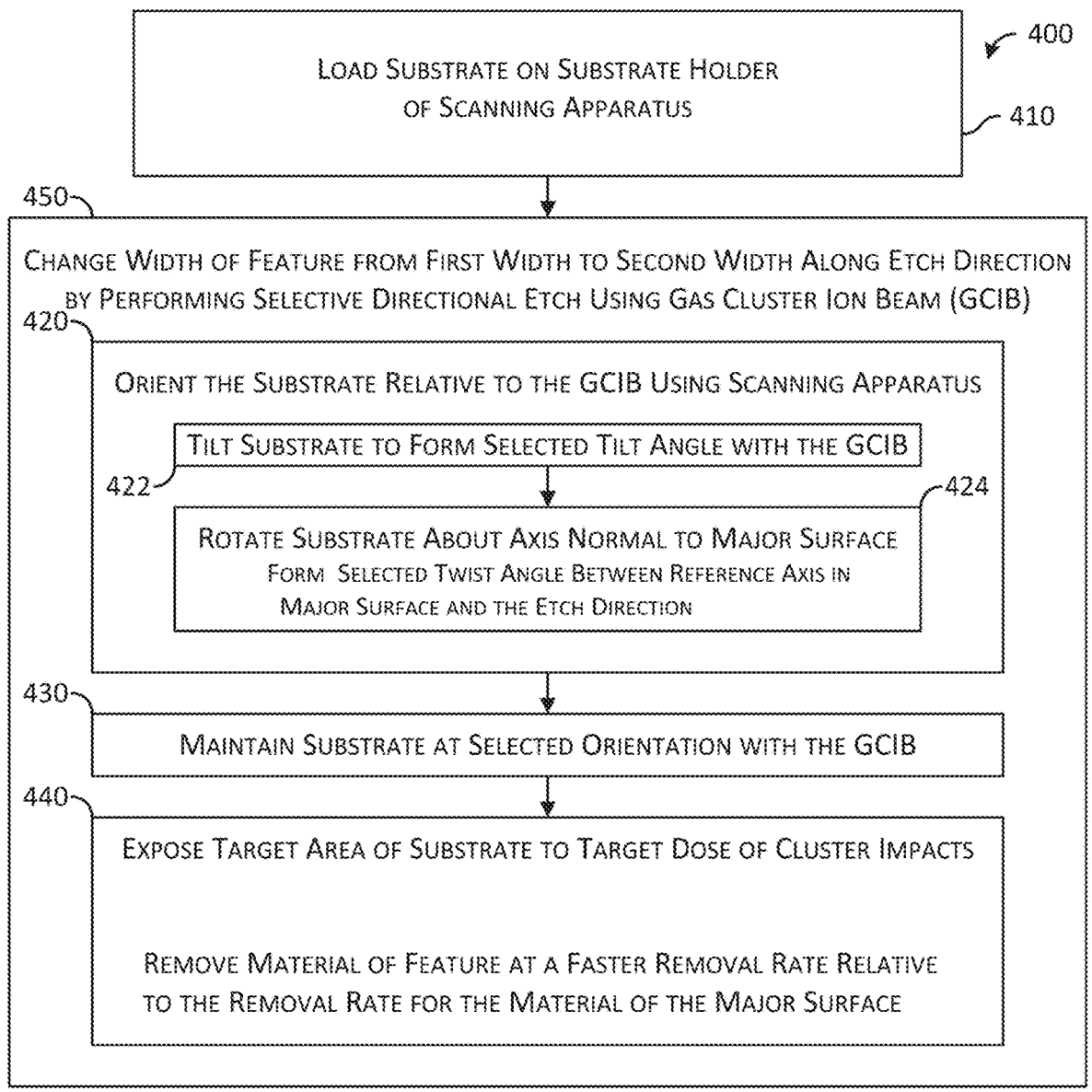
FIG. 4 is a block diagram illustrating an execution flow for the gas cluster ion beam pattern enhancement processes, shown in the planar and cross-sectional views illustrated in FIGS. 1A through 3B.

FIG. 4 is a block diagram for the execution flow 400 used to perform GCIB edge-displacement etches, such as those described above with reference to FIGS. 1A through 3B.

As indicated in block 410, in the execution flow 400, the substrate (e.g., substrate 200) is loaded on a substrate holder of a scanning apparatus. The incoming substrate has a feature such as lines, pillars, holes, or trenches, formed in a patterned layer (e.g., the photoresist patterned layer no) disposed over a major surface (e.g., the major surface of the substrate 200 comprising SiARC). The feature, (e.g., the openings 100) has a first width, w, along an etch direction. Portions of the major surface over which the patterned layer is disposed may be exposed.

A GCIB etch process may be used to change the width of the feature from the first width, w, to a second width along the first direction, as indicated by block 450 in FIG. 4. Prior to etching, the substrate is positioned to a desired orientation relative to the gas cluster ion beam using the scanning apparatus, as indicated in block 420 of the execution flow 400. Orienting the substrate comprises tilting the substrate (box 422) relative to the direction of the gas cluster ion beam and rotating the substrate (box 424) about the central axis (z-axis) normal to the major surface (the x-y plane). The tilt angle (θ) may be selected to be as close to a right angle as possible, subject to a constraint that helps avoid partial exposure of a sidewall along its height, as described above with reference to FIG. 2A. The rotation about the central axis may be performed through a twist angle selected to align the direction along which the width may be changed (the etch direction) to be parallel with a desired direction in the pattern. The twist angle ($\phi$) is defined with respect to a reference axis (the y-axis) in the plane of the major surface, as described above.

Once the substrate is oriented, it may be actively maintained at the selected orientation by the scanning apparatus for the duration of the process, as indicated in block 430.

In block 440 of the execution flow 400, the width of the feature is changed by an edge-displacement GCIB etch process that is used to re-position the sidewalls of the features in the patterned layer. The scanning apparatus moves the substrate through the gas cluster ion beam, thereby exposing a target area of the substrate to a target dose of cluster impacts. Exposure to the target dose of cluster impacts displaces the exposed sidewalls along the first direction. Clusters impinging on an exposed surface may remove material from the surface physically and chemically. In order to achieve the desired edge displacement without damaging the exposed portions of the major surface, the gases used by the GCIB source to form gas clusters comprise chemical etchants that may selectively remove the sidewall material at a faster removal rate relative to the respective removal rate of the material of the exposed major surface.

Although, in the execution flow 400, as well in other execution flows referred to in this disclosure to describe GCIB processes, the substrate orientation is selected by the scanning apparatus, in some other embodiment, the substrate may be oriented using a separate aligning mechanism. For example, an initial alignment to select an initial twist angle may be done using a separate substrate aligner (separate from the scanning apparatus) in the substrate transport path through which the substrate may be transported from outside the scanning apparatus to the substrate holder of the scanning apparatus. It is noted that, as described in U.S. Provisional Application No. 63/15,157, during scanning, the orientation of the wafer may have to be adjusted actively by rotation about the z-axis to maintain a constant twist angle in accordance with the (x, y) coordinates of the wafer.

Figure 5:
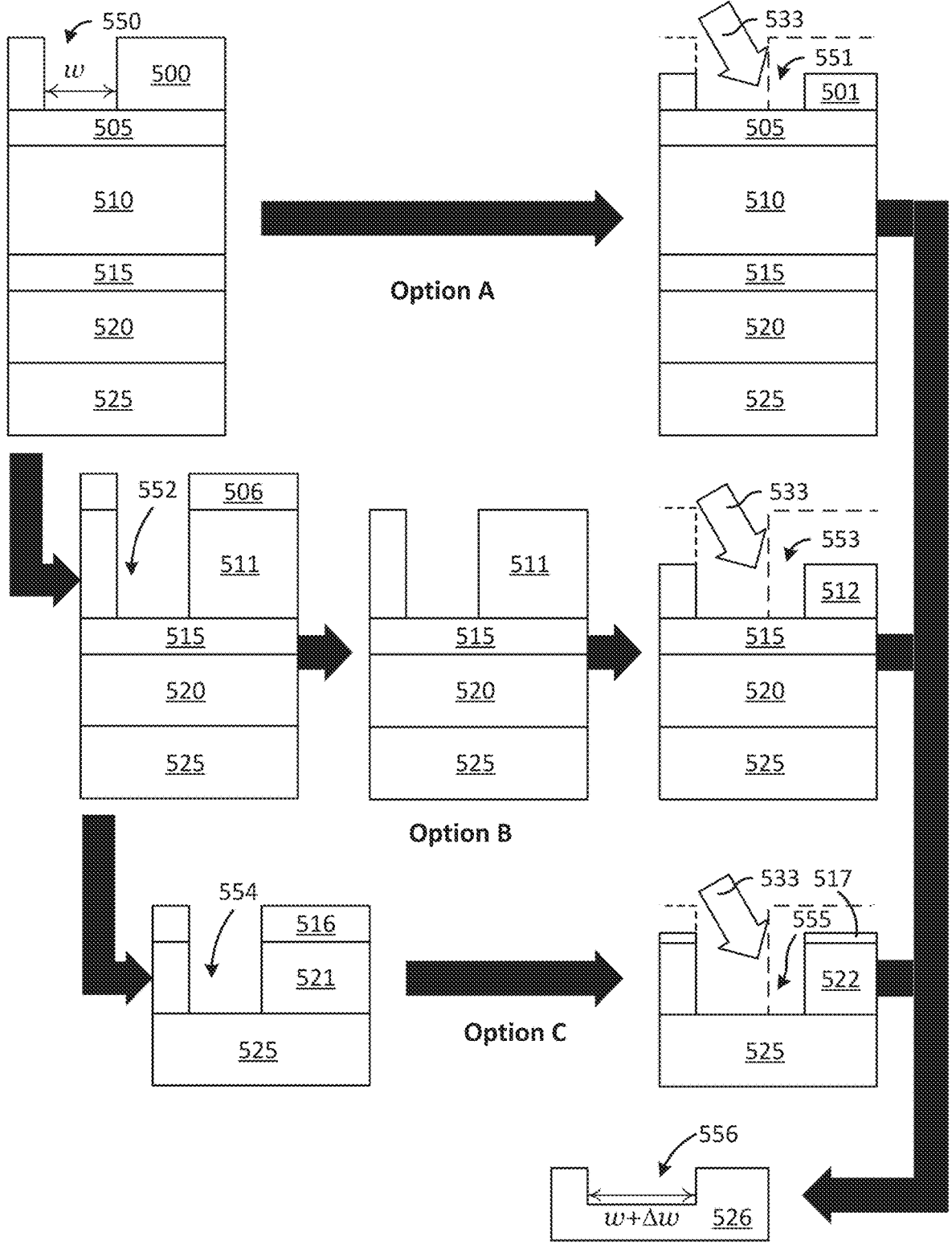
FIG. 5 illustrates cross-sectional views of a substrate at various intermediate stages of three different options for a fabrication flow, each option comprising a gas cluster ion beam pattern enhancement process, in accordance with some embodiment.

FIG. 5 illustrates an example of patterning a target layer 525 in an incoming substrate comprising a stack of layers, the topmost layer being a patterned layer 500 formed by transferring a radiation pattern onto a photoresist film. The description for the stack of layers of the incoming substrate in this example includes specific materials for the purpose of illustration, and should not be construed to be limiting.

Three different fabrication flow options have been illustrated in FIG. 5, each of which comprises a GCIB edge-displacement etch process step 533, indicated by an open arrow. For each of the options, the processing sequence is indicated by solid arrows between cross-sectional views of the substrate at various intermediate stages of fabrication.

All the three options in FIG. 5 use the same incoming substrate, having a top patterned layer 500 comprising an EUV photoresist. All three options use the same pattern of openings 550 of width, w, formed in the EUV photoresist. In all three options, trenches are patterned in the target layer 525 comprising a low dielectric constant (low-k) interlayer dielectric (ILD) such as fluorosilicate glass (FSG) or carbon-doped oxide (CDO). At the completion of each of the three fabrication flows, the patterned ILD layer 526 comprises trenches 556 having a width (w+$\Delta$w). For all three fabrication flow options, at some point in a sequence of processing steps, a GCIB edge-displacement etch process step 533 has been inserted. The GCIB process step 533 may edit the exposed pattern to change the width dimension from w to (w+$\Delta$w) by exposing the substrate to a gas cluster ion beam.

The three fabrication flows differ in the position where the GCIB process step 533 is inserted in the sequence of pattern-transfer and layer-strip etches performed to process a stack of four layers between the top patterned layer 500 and the target ILD layer 525 of the incoming substrate. The cross-sectional view of the substrate after the GCIB process step 533 is completed is indicated by an open arrow. The edge displacement ($\Delta$w) and the thickness reduction in the edited patterned layer are highlighted by a dashed outline of the surfaces of the respective initial pattern.

As illustrated in FIG. 5, the stack of four layers between the top patterned layer 500 and the target ILD layer 525 comprises a SiARC layer 505, shown underlying the photoresist patterned layer 500, followed by a stack of three hard mask layers. Adjacent to the SiARC layer 505 is a first hard mask layer 510 comprising spin-on carbon. A silicon dioxide second hard mask layer 515 may be an etch stop for a pattern-transfer etch that may be used to pattern the carbon first hard mask layer 510. The third hard mask layer 520 comprising titanium nitride is disposed adjacent to the low-k ILD layer 525. The titanium nitride third hard mask layer 520, or the titanium nitride third hard mask layer 520 in conjunction with the silicon dioxide cap (second hard mask layer 515) may be patterned and used as the hard mask for the final pattern-transfer etch used to pattern the ILD layer 525 to form the trenches 556 in the patterned ILD layer 526.

The sequence of pattern-transfer and layer-strip etches performed comprises a first pattern-transfer etch using an EUV photoresist mask to etch the SiARC layer. A second pattern-transfer etch may use the patterned SiARC as a hard mask to transfer the pattern to the carbon hard mask layer, stopping the etching on the silicon dioxide layer. The SiARC may be stripped prior to using the patterned carbon as the hard mask to pattern the underlying silicon dioxide and titanium nitride layers. Another layer-strip etch may be used to remove the carbon hard mask layer before the final pattern-transfer etch is performed to etch trenches in the ILD layer using the silicon dioxide and titanium nitride bilayer hard mask. The silicon dioxide and the titanium nitride layers remaining at the end of the etching may be stripped to form the final patterned ILD layer.

In the first fabrication flow, Option A, the GCIB edge-displacement etch process step 533 is inserted in the beginning of the fabrication flow. As illustrated in FIG. 5, the GCIB process step 533 of Option A may change the width, w, of the opening 550 to form a wider opening 551 of width (w+$\Delta$w) in the edited EUV photoresist patterned layer 501. The edited patterned layer 501 is used as a mask to etch the underlying SiARC layer 505, and the rest of the sequence of pattern-transfer and layer-strip etches may be performed in the usual way, as described above.

In the second fabrication flow, Option B, the EUV photoresist patterned layer 500 of the incoming substrate is used as a masking layer to etch the SiARC to form the patterned SiARC layer 506. The pattern may be transferred further down to etch the first carbon hard mask layer 510 to form the openings 552 in the patterned carbon hard mask layer 511. In Option B, the GCIB edge-displacement etch process step 533 is inserted after the SiARC strip to edit the patterned carbon hard mask layer 511. As illustrated in FIG. 5, the GCIB process step of Option B may change the width of the opening 552 to form a wider opening 553 of width (w+$\Delta$w)

in the edited patterned carbon hard mask layer 512. The edited patterned carbon hard mask layer 512 may be used as a mask to etch the underlying silicon dioxide second hard mask layer 515 and the titanium nitride third hard mask layer 520. The rest of the sequence of pattern-transfer and layer-strip etches may be performed in the usual way, as described above.

Oxygen can be used as an etchant to remove EUV photoresist selective to SiARC, and also as an etchant to remove spin-on carbon selective to silicon dioxide. Accordingly, a gas cluster ion beam comprising oxygen clusters may be used to perform the GCIB edge-displacement etch process steps in the first fabrication flow (Option A) and the second fabrication flow (Option B).

In the third fabrication flow, Option C, illustrated in FIG. 5, the usual sequence of processing steps, described above, is performed to transfer the pattern of the incoming EUV patterned layer 500 to form the openings 552 in the patterned carbon hard mask layer 511, and use the carbon hard mask layer 511 to pattern the second and third hard mask layers 515 and 520. As illustrated in FIG. 5, in Option C, the above sequence of processing steps forms the openings 554 having a width, w, in the patterned bilayer hard mask comprising the patterned silicon dioxide hard mask layer 516 and the patterned titanium nitride hard mask layer 521. The GCIB edge-displacement etch process step 533 is inserted at this position in the processing sequence of the third fabrication flow (Option C) to widen the opening 554. The opening 555, in the edited bilayer hard mask comprising the silicon dioxide hard mask layer 517 and the titanium nitride hard mask layer 522, has been widened from w to (w+Δw). Accordingly, after the final pattern-transfer etch is completed, the respective opening 556 in the patterned ILD layer 526 is also (w+Δw).

The gas cluster ion beam used for the GCIB edge-displacement etch process step 533 of Option C comprises $NF_3$ clusters since $NF_3$ can etch silicon dioxide and TiN selective to the low-k ILD. In this case, an additional layer such as aluminum nitride protects the target ILD layer 525 during the GCIB edge-displacement etch process step 533. The additional layer is subsequently removed.

For all three options, at the end of the sequence of process steps, the ILD layer 525 has been patterned forming a pattern of trenches 556 having the desired elongated width (w+Δw) in the patterned ILD layer 526.

It is generally desirable to have smooth surfaces of features in a patterned layer. One consequence of surface roughness is random variation in linewidth that may, in turn, cause random variations in the electrical properties of devices. For example, random variation in the gate length of minimum gate length transistors may result in an exponentially amplified variation in transistor subthreshold leakage. Likewise, the electrical resistances of minimum width interconnect lines may be very sensitive to linewidth variations. In various instances, forming smoother surfaces during patterning reduces electrical variability of circuit elements fabricated using the patterned layer. However, the patterning process may not yield the desired smoothness. For example, it is noted that photoresist lines patterned using an EUV photolithography system exhibit relatively high LER and LWR due to stochastic effects resulting from the high energy of EUV photons, as known to persons skilled in the art. As mentioned above, GCIB trim etch processes may be used to smooth rough surfaces. An example embodiment where a GCIB trim etch process has been applied to smooth the surfaces of a patterned photoresist layer is described with reference to FIGS. 6, 7A-7B, and 8A-8B. The method is illustrated using a block diagram shown in FIG. 9.

Figure 6:
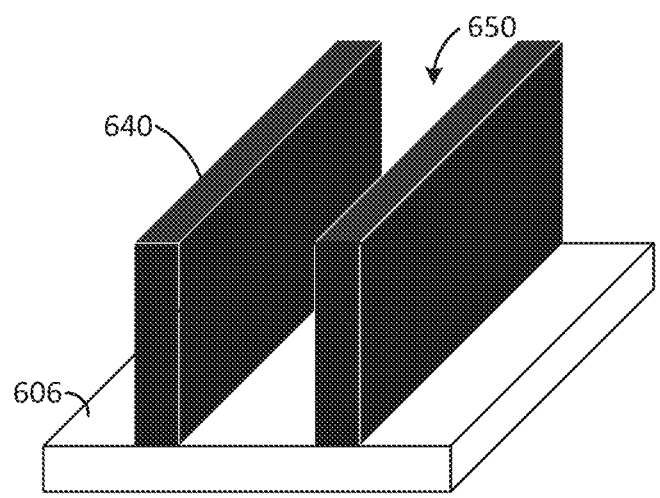
FIG. 6 illustrates a perspective view of a desired patterned layer comprising parallel lines.

FIG. 6 illustrates a perspective view of an example of a desired patterned layer comprising an array of parallel lines 640 formed over a major surface 606 of a substrate. Disposed between adjacent parallel lines 640 is a gap region 650. The pattern of parallel lines 640 with more realistically rough surfaces is shown in a cross-sectional view in FIG. 7A and in the respective top planar view in FIG. 7B. The sidewalls and the top surfaces, illustrated in the views in FIGS. 7A and 7B, are rough relative to the desired smooth surfaces of the parallel lines 640 illustrated in FIG. 6.

Figure 7A:
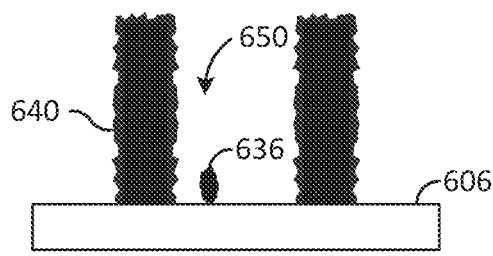
FIG. 7A illustrates a cross-sectional view of a substrate at an intermediate stage of a gas cluster ion beam pattern enhancement process, in accordance with an embodiment.
Figure 7B:
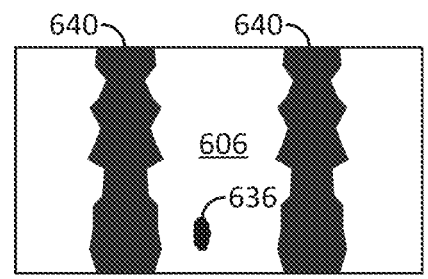
FIG. 7B illustrates a planar view of a substrate at an intermediate stage of the gas cluster ion beam pattern enhancement process, shown in the cross-sectional view illustrated in FIG. 7A.

In addition to the more realistic surface roughness, a photoresist residue 636 may be adhering to the major surface 606 in the gap region 650, as illustrated in FIGS. 7A and 7B.

In this example, the patterned layer of parallel lines 640 comprises an EUV photoresist and the major surface 606 of the substrate comprises a SiARC. It is understood that the innovative aspects of the described embodiment are applicable to other embodiments using other materials.

Figure 8A:
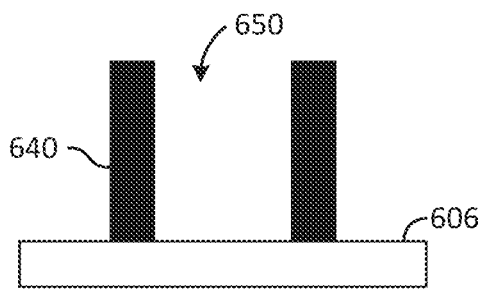
FIG. 8A illustrates a cross-sectional view of a substrate at an intermediate stage of a gas cluster ion beam pattern enhancement process, in accordance with an embodiment.
Figure 8B:
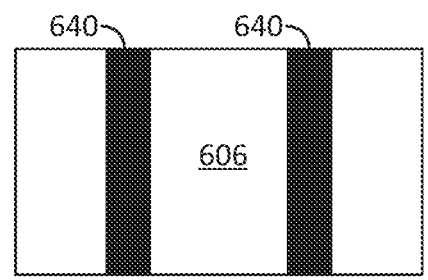
FIG. 8B illustrates a planar view of a substrate at an intermediate stage of the gas cluster ion beam pattern enhancement process, shown in the cross-sectional view illustrated in FIG. 8A.

In FIGS. 8A and 8B, a GCIB trim etch process has been performed. FIG. 8A illustrates the cross-sectional view of the structure in FIG. 7A, and FIG. 8B illustrates the respective top planar view. As illustrated in FIGS. 8A and 8B, the surfaces of the photoresist parallel lines 640 have the desired smoothness. Furthermore, the GCIB trim etch process has descummed the pattern by removing the photoresist residue 636 from the SiARC major surface 606.

Figure 9:
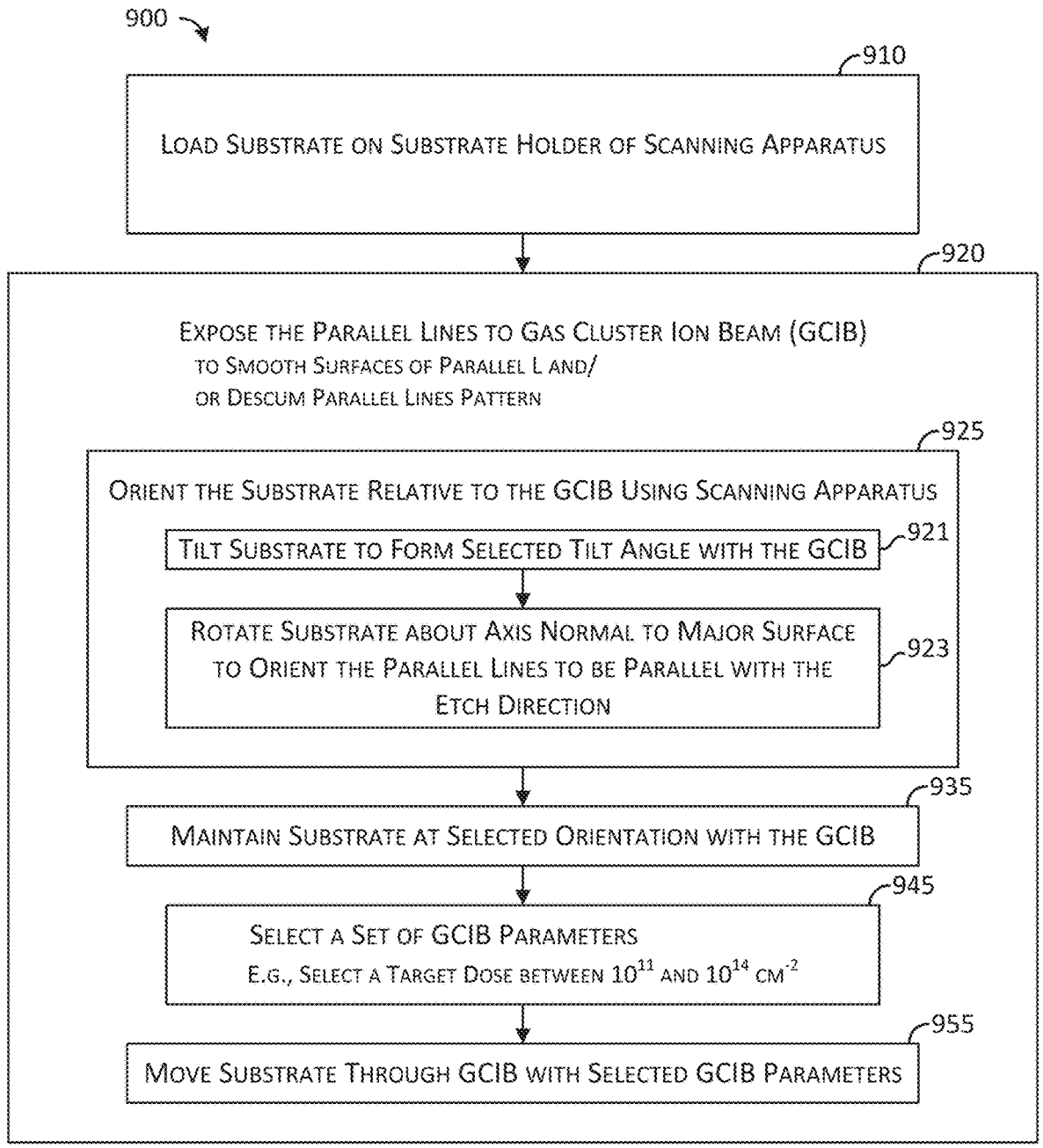
FIG. 9 is a block diagram illustrating an execution flow for the gas cluster ion beam pattern enhancement process, shown in the planar and cross-sectional views illustrated in FIGS. 7A through 8B.

An execution flow 900 for performing a GCIB trim etch process is illustrated in the block diagram in FIG. 9. Referring to FIG. 9, the execution of GCIB trim etch processing commences with loading an incoming substrate on a substrate holder of a scanning apparatus, as indicated in block 910 of the execution flow 900. The incoming substrate, in this example, comprises a major surface (e.g., major surface 606) and a plurality of parallel lines (e.g., parallel lines 640) disposed over the major surface.

The plurality of parallel lines may be exposed to a gas cluster ion beam in order to smooth the surfaces of the parallel lines, and also to descum the parallel lines by removing residues of EUV photoresist on the major surface, as indicated by block 920 of the execution flow 900. Exposing the parallel lines may involve executing several actions: orienting the substrate relative to the gas cluster ion beam (box 925), maintaining the substrate at the selected orientation (box 935), selecting a set of gas cluster ion beam parameters (box 945), and moving the substrate through the gas cluster ion beam using the scanning apparatus.

The gas cluster ion beam is in a fixed direction, referred to here as the beam direction, and its orthogonal projection onto the major surface may be referred to as the etch direction. Note that, in the context of a GCIB trim etch process, the term etch direction is not the direction in which a dimension of a feature is being changed. In contrast to a GCIB edge-displacement process, the GCIB trim etch process is not intended to modify the dimension of a feature. The GCIB trim etch process may be used to smooth surfaces by etching protrusions or reduce defects by etching residues (e.g., photoresist residue). The orientation of the substrate may be adjusted relative to the gas cluster ion beam (box 925 of block 920). The substrate may be tilted to a tilt angle (θ) selected to be as close to a right angle as possible within constraints (box 921), as discussed above with reference to FIG. 2A. In various embodiments, θ may be about 55° to about 85°, depending on the capability of the scanning apparatus and tilt angle control. In addition, the substrate may be rotated about an axis normal to the major surface by a twist angle. The twist angle (ϕ) is selected to align the parallel lines to be parallel with the etch direction (box 923).

At this orientation of the parallel lines, the clusters in the gas cluster ion beam are likely to collide with random photoresist protrusions from the top surface and from the sidewalls into the gap region between adjacent lines while having negligible effect on the dimensions of the patterned photoresist layer. Because the gas cluster ion beam etches sidewalls primarily in a direction parallel with the etch direction, the edge displacement would be minimal with the parallel lines oriented parallel with the etch direction. The high tilt angle would also reduce the photoresist loss from the top surfaces of the parallel lines, as explained above with reference to FIG. 2A.

The relatively loosely bound clusters disintegrate upon impact with the photoresist protruding from the surfaces of the parallel lines. The large number of constituent atoms/molecules from a disintegrating cluster may be scattered in various directions analogous to mud splattering on an automobile windshield. This provides a lateral sputtering effect which further assists in smoothing the photoresist lines. Since only a small amount of material removal is involved for smoothing, the GCIB trim etch is generally performed using a low dose of cluster impacts. As indicated in box 945 of block 920, a dose of about $10^{11}$ cluster impacts per $cm^2$ to about $10^{16}$ cluster impacts per $cm_2$ may be selected in various embodiments. The gas cluster ion beam may comprise, for example, oxygen clusters to etch photoresist selective to the SiARC major surface or a mixture of argon and oxygen.

In addition to enhancing patterns by reducing random variations in a critical dimension such as LER and LWR, the GCIB etch technique may be applied to reduce systematic variations in a critical dimension by using location specific processing (LSP). As mentioned above, in an LSP method, the process is dynamically altered during processing in accordance with the location of the substrate. This may be achieved by varying an adjustable process parameter while the substrate is moved along a scan trajectory. The adjustable process parameter is referred to as a control parameter.

A location specific etch may be performed using a GCIB-LSP edge-displacement etch process in which, for example, the total dose of cluster impacts/$cm^2$ of the gas cluster ion beam is used as the control parameter to provide a location specific edge displacement. The edge displacement also depends on other process parameters that may be selected to be a control parameter, for example, tilt angle and dwell time. The dwell time may be defined as the local exposure time per unit area. The twist angle may also be a control parameter if the direction of the etch needs to be location specific. The control parameter may comprise any set of adjustable process parameters that may alter the pattern metric that is being changed to enhance the pattern quality. The values of the components of the set would then collectively be referred to as the value of the control parameter.

Consider, for example, that it is known from measurements that the linewidth of a feature is bigger than its target value by an amount that increases progressively with increasing radial distance of the location of the features from the center to the edge of the substrate. If the location specific linewidth data is also provided, then this information may be utilized to design, for example, a GCIB-LSP edge-displacement etch, to reduce the linewidth errors. For example, the total dose of cluster impacts/$cm^2$ may be increased as the location of the center of the substrate approaches the gas cluster ion beam and vice versa. The location specific linewidth errors may be calculated from the location specific linewidth data and transformed to location specific values of the total dose of cluster impacts/$cm^2$ using a known relationship between edge displacement and the total dose of cluster impacts/$cm^2$ obtained a priori from process characterization data. Once the location specific control parameter values are calculated, the substrate may be moved along a selected scan trajectory by a scanning apparatus and the control parameter may be adjusted by a controller, in accordance with the location specific calculated values.

Figure 10:
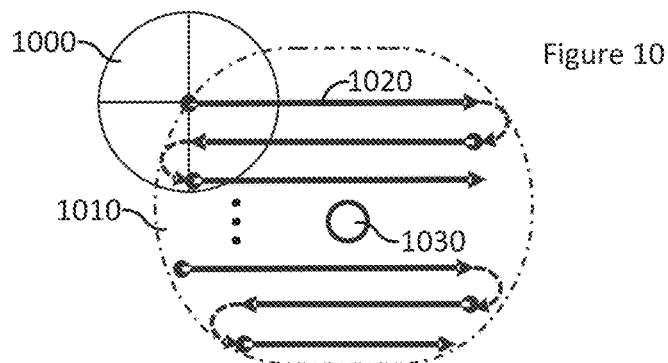
FIG. 10 illustrates a schematic of a substrate moved in a planar scan area along a scan trajectory, in accordance with an embodiment.

FIG. 10 illustrates an example of a substrate 1000 being moved in a planar scan area 1010 along a scan trajectory 1020 through a gas cluster ion beam 1030. The scan trajectory 1020, in FIG. 10, is a horizontal raster starting at the top left of the scan area 1010 and comprises a family of horizontal traces indexed to cover the scan area from top-to-bottom. The scan area has an extra width margin which may be used to ramp up the wafer velocity from zero at the beginning of a trace and ramp it down to zero before the return trace. After indexing down to the bottom of the scan area, a return scan may be initiated. The scans are repeated till the GCIB process is complete. A GCIB processing system that may perform the process is illustrated further below with reference to FIGS. 12, 13, and 14A-C. The in-plane motion may be synchronized with the angular orientation by active control and synchronized rotary actuators, as mentioned below with reference to FIGS. 12A, 12B, and 13, and described in detail in the U.S. Provisional Application No. 63/15,157.

Figure 11:
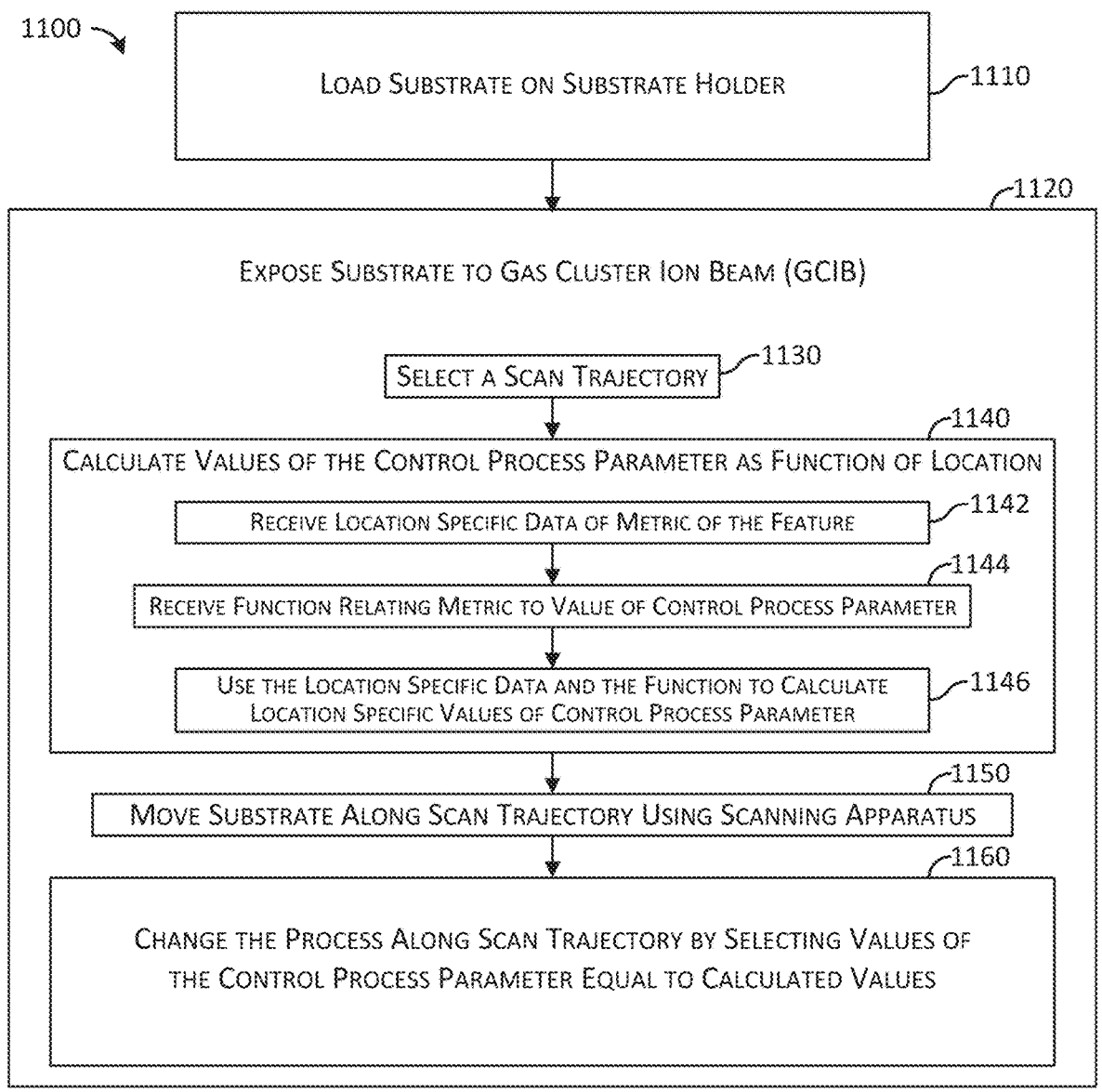
FIG. 11 is a block diagram illustrating an execution flow for a location specific gas cluster ion beam pattern enhancement process, in accordance with an embodiment.
Figure 12:
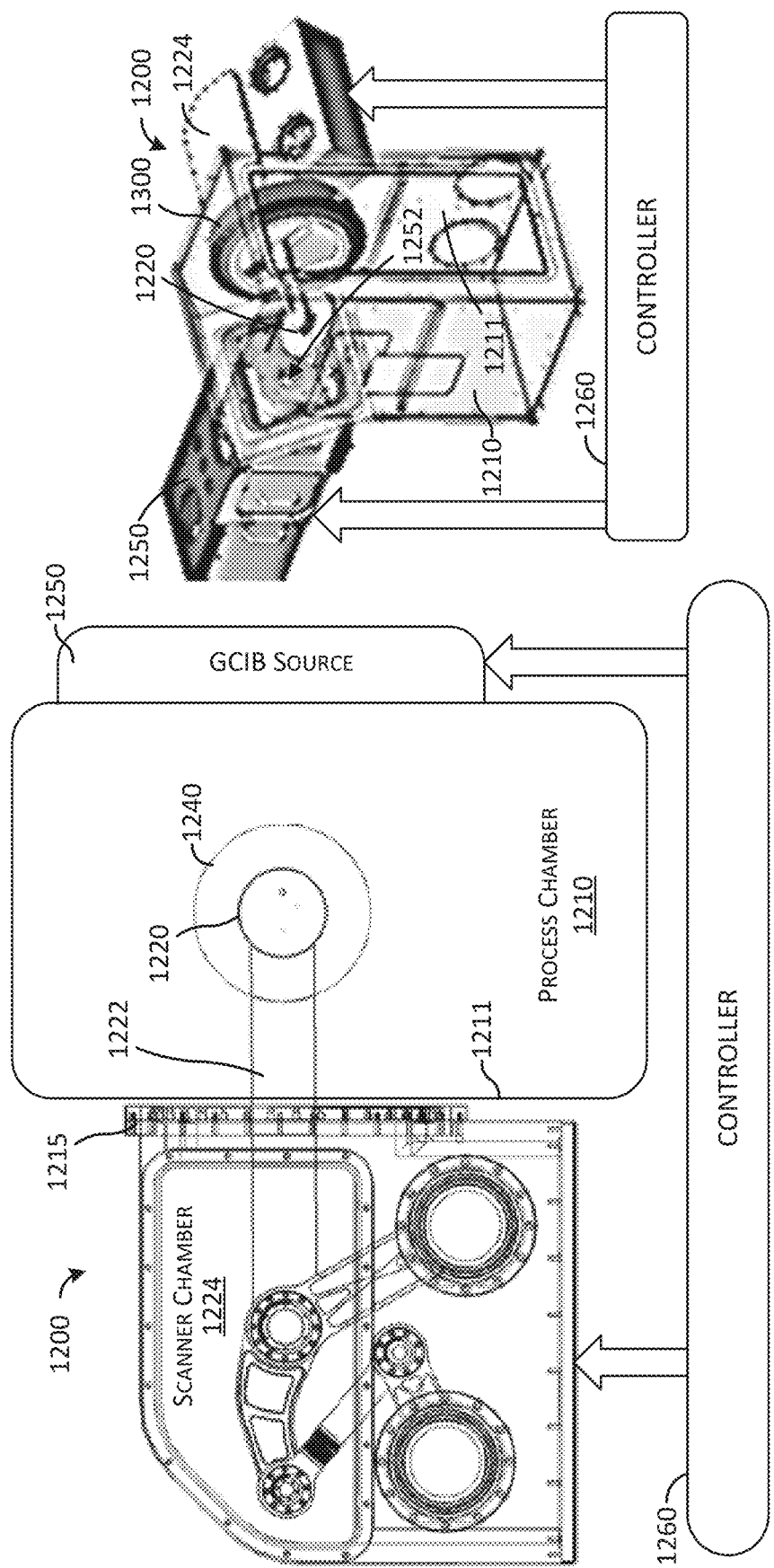
FIG. 12A is a schematic of a gas cluster ion beam processing system loaded with a substrate, in accordance with an embodiment.
FIG. 12B is a perspective view of the gas cluster ion beam processing system and substrate, shown in the schematic in FIG. 12A.

FIG. 11 illustrates a block diagram for a GCIB-LSP process execution flow 1100 that may be used for pattern enhancement by achieving, for example, reduced variability in a critical dimension with location specific error correction.

In block 1110, a substrate comprising a patterned layer formed over a major surface is loaded on a substrate holder of a scanning apparatus. Consider a first feature in the patterned layer disposed at a first location, and a second feature disposed at a second location over the major surface. Location specific processing is achieved by exposing the first feature to a first gas cluster ion beam that processes the feature according to a first process parameter, and exposing the second feature to a second gas cluster ion beam that processes the feature according to a second process parameter, as indicated by block 1120 of the GCIB-LSP process execution flow 1100. Selecting the first process parameter different from the second process parameter results in location specific processing of the features by the gas cluster ion beam.

The first process parameter and the second process parameter are two values of a control process parameter. For example, the first process parameter and the second process parameter may be two different total cluster doses selected to provide the two desired edge displacements at the two respective locations. In order to expose the first feature and the second feature to the gas cluster ion beam, involves executing a series of actions that comprises selecting a scan trajectory (box 1130) that includes the locations of the features, calculating the values of the control process parameter (block 1140) as a function of location of the substrate along the scan trajectory, moving the substrate continuously along the scan trajectory using a scanning apparatus (box 1150), and changing the process along the scan trajectory by selecting the location specific value of the control process parameter to be same as the respective calculated value (box 1160). For example, the value of the control process parameter at the first location is equal to the first process parameter, and the value of the control process parameter at the second location is equal to the second process parameter.

In order to appropriately calculate the values of the control process parameter as a function of location of the substrate along the scan trajectory the GCIB processing system has to receive some information about the incoming substrate and the GCIB etch process. The received information comprises the location specific data of a metric of the feature (e.g., the linewidth data across various locations of the major surface), as indicated in box 1142, and the function relating the metric to a value of the control process parameter (box 1144), for example, process characterization data relating the total cluster dose to the edge displacement. As indicated in box 1146, the location specific data may be used to calculate the edge displacement desired at each location, and the function may be used in calculating the respective value of the control parameter, for example, the total cluster dose per unit area at the respective location.

In the execution flow 1100, the corrections are performed while the wafer is moved once along a single trajectory. However, it is understood that in some other embodiment a first scan may be performed with a first twist angle, $\phi_1$, to make edge corrections in one direction, and a second scan may be performed with a second twist angle, $\phi_2$, to make edge corrections in the opposite direction. The corrections in the opposite direction may be performed by selecting $\phi_2=\phi_1+180°$. Both the corrections may be performed successively on the same substrate.

Although we have described GCIB-LSP processing for error correction, the GCIB-LSP technique may also be applied to implement fabricating a feature with different target values, such as one target value for features in a region within a particular radius from the center substrate, and a second target value for features in a region beyond a particular radius from the center substrate. The variable may be a dimension such as a width. The variable may also be a direction such as the direction of the major axis of oval shaped holes in an array of holes.

FIGS. 12A and 12B illustrate an example GCIB gas cluster ion beam processing system comprising a scanning apparatus 1200 coupled to a process chamber 1210, a GCIB source 1250 (partially behind the process chamber 1210 in FIG. 12A), and a controller 1260, for example, an electronic programmable controller that may control the scanning apparatus 1200 and the GCIB source 1250. The scanning apparatus and method are described in detail in U.S. Provisional Application No. 63/15,157. A substrate holder 1220 loaded with a substrate 1240 is shown disposed inside the process chamber 1210. The plane of the substrate holder 1220 is parallel with the plane of the major surface of the substrate 1240. The substrate holder 1220 is attached at the end of a bar link 1222 of the scanning apparatus 1200 that extends into the process chamber 1210 through a rotatable feedthrough 1215. One side of the rotatable feedthrough 1215 is rigidly attached to a vertical wall 1211 of the process chamber 1210. The opposite side may be rotated relative the side attached to the wall of the process chamber 1210. This rotatable side is attached to a scanner chamber 1224 which houses several bar links, hinges, and rotary actuators. Thus, the rotatable feedthrough 1215 may rotate the entire scanner chamber 1224 about an axis normal to the wall of the process chamber 1210, as seen in a perspective view illustrated in FIG. 12B.

The perspective view of the GCIB system in FIG. 12B illustrates the GCIB source 1250 coupled to the process chamber 1210. A gas cluster ion beam may pass through an aperture 1252 toward the substrate holder 1220 inside the process chamber 1210. The direction of the gas cluster ion beam is fixed. The scanning apparatus 1200 may tilt the substrate holder 1220 (and the substrate 1240) relative to the gas cluster ion beam, rotate the plane of the major surface, and move the substrate holder 1220 (and the substrate 1240) along an in-plane scan trajectory to expose the substrate 1240 to the gas cluster ion beam. The scan trajectory is in a plane, referred to as the scanning plane. The scanning apparatus 1200 is designed to maintain the scanning plane roughly in parallel with the major surface of the substrate 1240.

Figure 13:
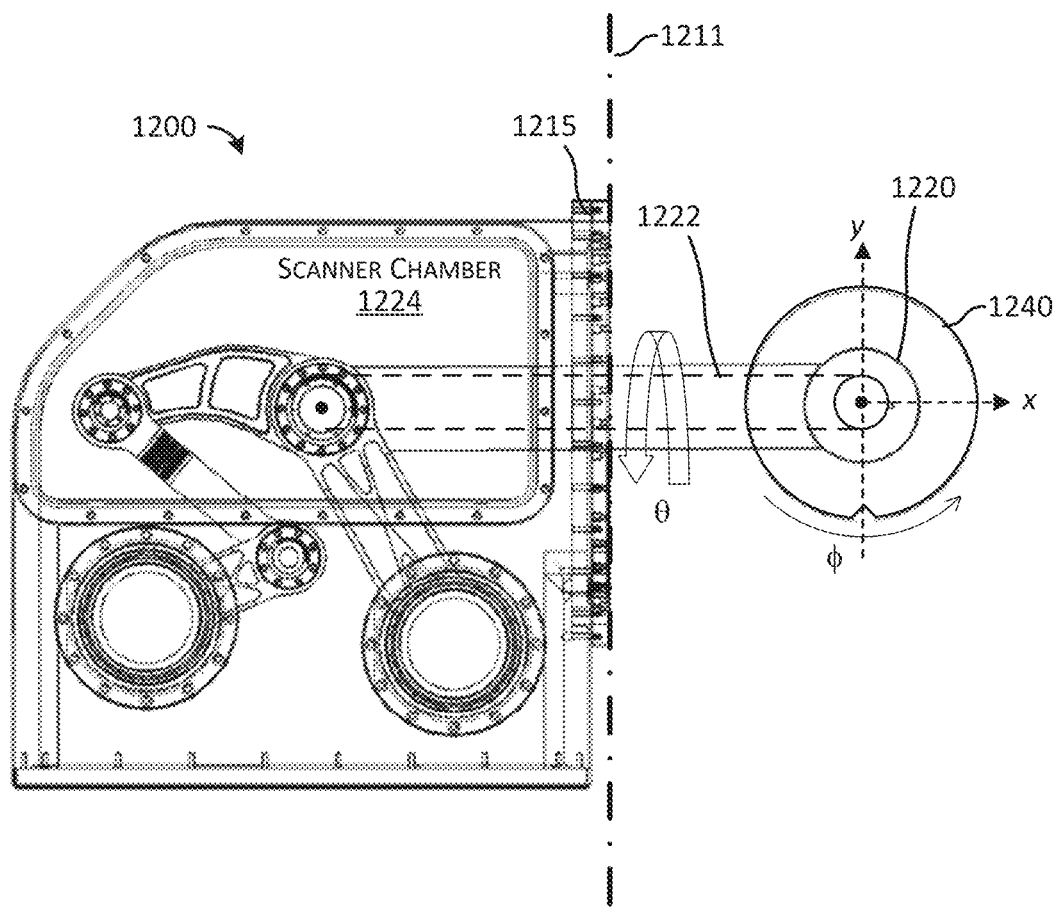
FIG. 13 illustrates a cross-sectional view of a scanning apparatus loaded with a substrate, in accordance with an embodiment.

FIG. 13 illustrates a cross-sectional view of the scanning apparatus 1200 used to describe selection of an orientation of the substrate 1240 relative to the gas cluster ion beam. The wall 1211 to which the rotatable feedthrough 1215 is affixed is indicated by a dot-dash line; the rest of the process chamber 1210 is omitted for clarity. The scanner chamber 1224 attaches to the rotatable side, as described above. A pair of parallel dashed lines in bar link 1222 represents a motorized belt-and-pulley system connected between a rotary hinge and the substrate holder 1220 of the scanning apparatus 1200.

Generally, a substrate comprises a stack of patterned layers. The patterns are aligned to each other and to a reference direction in the plane of a major surface of the substrate. The notch in the major surface of the substrate 1240 in FIG. 13 defines the reference direction in the plane of the major surface. For example, the direction of the line connecting the notch and the center of the substrate may be selected as the reference axis, referred to as the y-axis. The y-axes and the orthogonal x-axis (indicated by two dashed arrows in FIG. 13) define the plane of the major surface of the substrate 1240.

Figure 14A:
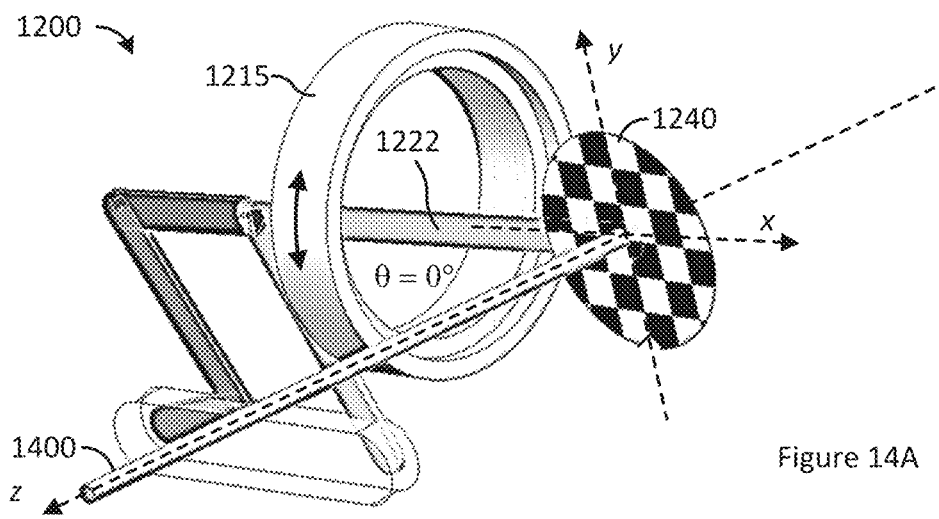
FIGS. 14A-14C illustrate schematics of a scanning apparatus loaded with a substrate rotated through various angles, in accordance with an embodiment.
Figure 14B:
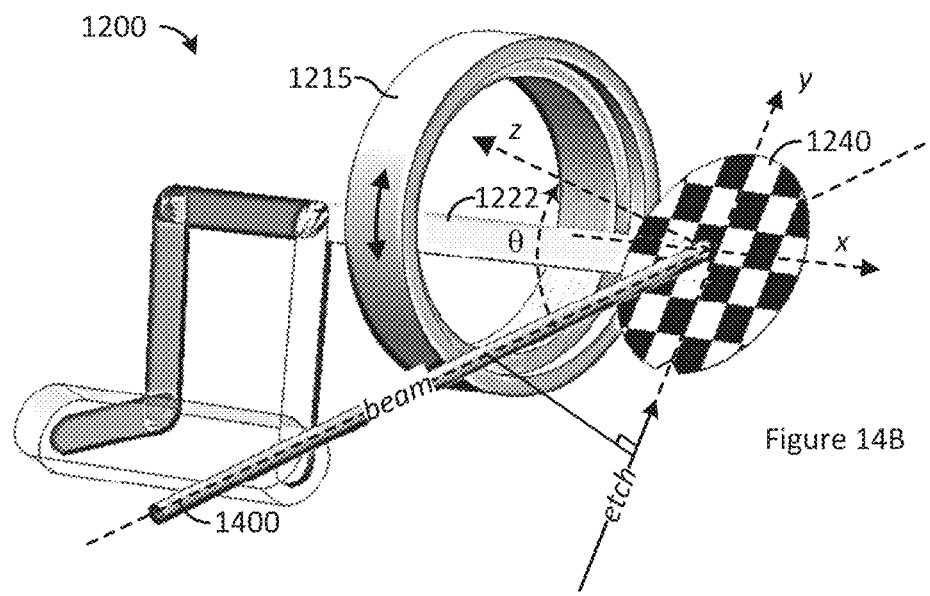
Figure 14C:
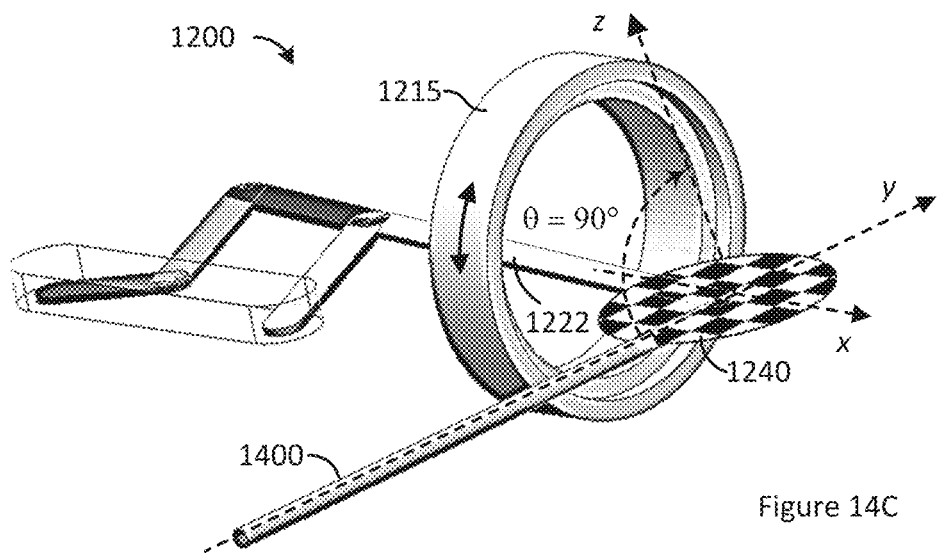

The reference y-axis may be rotated through an angle, $\phi$, by rotating the substrate holder 1220 (and the substrate 1240) about a central axis normal to the x-y plane (not visible here, but shown as the z-axis in FIGS. 14A-14C). The angle, $\phi$, is referred to as the twist angle. The orientation of the substrate 1240 in FIG. 13 depicts an orientation where $\phi=0°$. The $\phi=0°$ orientation is defined here in reference to the plane of the wall 1211 of the process chamber 1210. At $\phi=0°$, the y-axis is parallel with, and the x-axis is normal to the plane of the wall 1211. At this orientation, an orthogonal projection of the gas cluster ion beam onto the x-y plane would be parallel with the y-axis. This would be illustrated in further detail in FIGS. 14A-14C. The rotation of the plane of the major surface of the substrate 1240 and substrate holder 1220 (the x-y plane), is indicated by an arc-shaped arrow near the notch. Rotating the substrate 1240 (or changing $\phi$) alters the orientation of the features in a patterned layer relative to the gas cluster ion beam. For example, if at $\phi=0°$, the in-plane component of a gas cluster ion beam is parallel with a line in the y-direction then at $\phi=90°$, the same gas cluster ion beam would have an in-plane component intersecting the same line perpendicularly. The twist angle, $\phi$, may be selected by rotating the substrate holder 1220 using a motorized belt-and-pulley system embedded in the bar link 1222 to which the substrate holder 1220 is attached. In the example scanning apparatus 1200, the motorized belt-and-pulley system in the bar link 1222 may also be used synchronously with the rotary actuators to maintain a constant $\phi$ when the substrate 1240 is moved along a scan trajectory in the x-y plane. The rotary actuators that move the wafer 1240 in the scanning plane are synchronized with each other and are also synchronized with the motorized belt-and-pulley system in the bar link 1222 by the controller 1260 to actively maintain the angular orientation of the wafer 1240 (the twist angle) constant synchronously with the in-plane motion along the selected scan trajectory.

As mentioned above with reference to FIG. 12B, the rotatable feedthrough 1215 may rotate the entire scanner chamber 1224 about an axis normal to the wall 1211 of the process chamber 1210. In FIG. 13, this is indicated by a broad open curled arrow. A rotation of the x-y plane through an angle, θ, would tilt the substrate 1240 relative to the gas cluster ion beam by a tilt angle, θ. The θ=0° orientation is defined here in reference to the direction of the gas cluster ion beam. At θ=0°, the gas cluster ion beam is normal to the x-y plane (also the plane of the major surface of the substrate 1240). The tilt angle is explained further with reference to FIGS. 14A-14C.

FIGS. 14A-14C show schematics of the scanning apparatus 1200 loaded with a substrate 1240. In FIGS. 14A-14C, the substrate holder 1220 and substrate 1240 are shown oriented at three different values of the tilt angle, θ. The tilt angle, θ, may be selected using the rotatable feedthrough 1215 of the scanning apparatus 1200, as described above and indicated by a curved double arrow in FIGS. 14A-14C. A checkerboard pattern and a wafer notch marked on the major surface of the substrate 1240 indicate that the twist angle, φ=0° in all three cases illustrated in FIGS. 14A-14C. The long cylindrical rod represents a gas cluster ion beam 1400 incident on the substrate 1240 along a fixed direction, referred to as the beam direction and indicated by a dashed line passing through the gas cluster ion beam 1400.

In FIG. 14A, the gas cluster ion beam 1400 is perpendicular to (θ=0°) the major surface (the x-y plane) of the substrate 1240. Accordingly, the normal to the major surface (the z-axis) is coincident with the gas cluster ion beam 1400.

In FIG. 14B, the rotatable feedthrough 1215 has been rotated through an angle, θ, thereby tilting the substrate by a tilt angle, θ, as described above. Accordingly, the normal to the major surface (the z-axis) forms an angle, θ, with the gas cluster ion beam 1400. It may be noted that, since φ=0°, the etch direction (defined as the direction of the projection of the gas cluster ion beam 1400 onto the x-y plane) would be parallel with the y-axis. The beam direction and the etch direction are labeled in FIG. 14B.

In FIG. 14C, the gas cluster ion beam 1400 is parallel with (θ=90°) the major surface (the x-y plane) of the substrate 1240. Accordingly, the normal to the major surface (the z-axis) is perpendicular to the gas cluster ion beam 1400.

In this disclosure we have described embodiments of methods to enhance patterns using GCIB processes performed using a GCIB system. The described embodiments may provide several advantages. The GCIB edge-displacement etch processes may be used to edit patterned layers to create, for example, sub-resolution features at a relatively low cost. The embodiments of GCIB trim etch processes, described herein, provide several advantages. A GCIB trim etch may be applied to removing etch residue (e.g., descumming a photoresist pattern) and to smoothen surfaces. Smoothening sidewalls of features in a patterned layer enhances a pattern by reducing random electrical variations resulting from LER and LWR. Another technique utilizing GCIB processing are the embodiments of GCIB-LSP described in this disclosure. GCIB-LSP may provide the advantages of correcting CD variations using prior information of location specific measurements of the incoming substrates and GCIB process characterization data. The location specific etch capability provided by the GCIB-LSP technique may also enable fabrication of a plurality of IC designs on the same substrate, where each design uses a different target value for a CD at some pattern level.

Example 1. A method of processing a substrate includes loading the substrate on a substrate holder. The substrate includes a major surface and a feature disposed over the major surface. The feature has a first width along an etch direction. The method includes exposing portions of the major surface and changing the first width of the feature to a second width along the etch direction by etching a first portion of the sidewalls of the feature with a gas cluster ion beam oriented along a beam direction.

Example 2. The method of example 1, wherein the etch direction is along the orthogonal projection of the beam direction on the major surface so that the gas cluster ion beam is inclined at a tilt angle with a normal to the major surface or the etch direction is parallel to the major surface and perpendicular to the sidewalls.

Example 3. The method of example 1, wherein the substrate is oriented in a first orientation relative to the etch direction while changing the first width. The method further includes rotating the substrate to a second orientation relative to the etch direction, and changing the second width of the feature to a third width along the etch direction by etching a second portion of the sidewalls of the feature with the gas cluster ion beam oriented along the beam direction.

Example 4. The method of example 3, wherein the rotating the substrate to the second orientation relative to the etch direction is performed by the scanning apparatus or a separate aligning mechanism.

Example 5. The method of example 3, wherein the difference between the first width and the second width is different from the difference between the second width and the third width.

Example 6. The method of example 1, further including: loading the substrate on the substrate holder of a scanning apparatus; and orienting, using the scanning apparatus, the substrate relative to the gas cluster ion beam by tilting the substrate at a selected tilt angle, the tilt angle being the angle formed by the gas cluster ion beam and a line normal to the major surface; and rotating the substrate about an axis normal to the major surface, wherein the rotation orients a reference axis in the major surface to form a selected twist angle between the reference axis and a line parallel with the etch direction.

Example 7. The method of example 1, further includes orienting the substrate relative to the gas cluster ion beam while loading the substrate using a substrate aligner separate from the scanning apparatus.

Example 8. The method of example 6, wherein the tilt angle is selected for the gas cluster ion beam to impinge on a boundary between the exposed portion of the major surface and a sidewall of the feature, and wherein the tilt angle is selected to reduce the difference between the tilt angle and a right angle.

Example 9. The method of example 1, wherein the feature is within a patterned first layer that is disposed over the major surface and the major surface including a second layer. The first layer includes a first material and the second layer includes a second material. In the method, changing the width of the feature along the etch direction includes maintaining the substrate at a fixed orientation relative to the gas cluster ion beam; exposing a target area of the substrate to a target dose of cluster impacts by moving the substrate through the gas cluster ion beam; and removing the first material at a faster removal rate relative to the respective removal rate of the second material.

Example 10. The method of example 9, wherein moving the substrate through the gas cluster ion beam includes moving the substrate in the plane of the major surface.

Example 11. The method of example 1, wherein the feature is an opening within a patterned first layer that is disposed over the major surface, wherein the sidewalls of the opening form the sidewalls of the feature, wherein the width of the feature along the etch direction is a width of the opening between opposite sidewalls of the opening along the etch direction, and wherein changing the width of the feature along a etch direction increases the width of the opening along the etch direction.

Example 12. The method of example ii, wherein the feature is adjacent to a second opening within the first layer, the second opening being patterned simultaneously with the feature using a photolithography technique; wherein, along the etch direction, a dimension of the first layer between a sidewall of the feature and the adjacent sidewall of the second opening is greater than or equal to a resolution limit of the photolithography technique; and wherein changing the width of the feature along the etch direction reduces the dimension of the first layer along the etch direction between a sidewall of the feature and the adjacent sidewall of the second opening to be less than the resolution limit of the photolithography technique.

Example 13. The method of example 1, wherein the feature is a construct within a patterned first layer that is disposed over the major surface, the first layer being patterned using a photolithography technique, wherein the sidewalls of the construct form the sidewalls of the feature, wherein the width of the feature along the etch direction is a width of the construct between opposing sidewalls of the construct along the first direction, the width of the construct being greater than or equal to a resolution limit of the photolithography technique, wherein changing the width of the feature along the etch direction reduces the width of the feature along the etch direction to less than the resolution limit of the photolithography technique.

Example 14. The method of example 1, wherein the feature is within a patterned first layer that is disposed over the major surface, the first layer being a hard mask including spin-on carbon, or silicon oxide, or silicon nitride, or silicon anti-reflective coating, or titanium nitride, or a metal, or a metal oxide, or a combination thereof.

Example 15. A method of processing a substrate includes loading the substrate on a substrate holder, the substrate including a major surface and a plurality of parallel lines disposed over the major surface; and exposing the plurality of parallel lines to a gas cluster ion beam oriented in a beam direction, the beam direction having an orthogonal projection onto the major surface, the orthogonal projection being oriented in an etch direction, wherein the plurality of parallel lines are parallel with the etch direction.

Example 16. The method of example 15, wherein the exposing causes a smoothing of the surfaces of the plurality of parallel lines.

Example 17. The method of example 15, wherein the exposing descums the plurality of parallel lines.

Example 18. The method of example 15, wherein exposing the plurality of parallel lines to a gas cluster ion beam includes: loading the substrate on the substrate holder of a scanning apparatus; and orienting, using the scanning apparatus, the substrate relative to the gas cluster ion beam by tilting the substrate at a selected tilt angle, the tilt angle being the angle formed by the beam direction and a line normal to the major surface; and rotating the substrate about an axis normal to the major surface, wherein the rotation orients the parallel lines in the etch direction; maintaining the substrate at a fixed orientation relative to the gas cluster ion beam; selecting a set of gas cluster ion beam parameters; and moving the substrate through the gas cluster ion beam with the selected set of gas cluster ion beam parameters.

Example 19. The method of example 18, wherein the gas cluster ion beam provides a target dose between $10^{11}$ cm$^{-2}$ to $10^{16}$ cm$^{-2}$, and the selected tilt angle has a magnitude between 55° and 85°.

Example 20. The method of example 15, wherein the plurality of parallel lines includes lines having a core structure including a first material and a sidewall structure including a second material, the second material being different from the first material.

Example 21. A method of processing a substrate includes loading the substrate on a substrate holder, the substrate including a major surface, a first feature disposed over the major surface at a first location, and a second feature disposed over the major surface at a second location; exposing the first feature to a first gas cluster ion beam with a first process parameter; and exposing the second feature to a second gas cluster ion beam with a second process parameter, the first process parameter being different from the second process parameter.

Example 22. The method of example 21, further including selecting the first process parameter and the second process parameter based on location specific data of a metric of the first feature and the second feature.

Example 23. The method of example 22, wherein the first process parameter and the second process parameter are selected based on: receiving location specific data of the metric of the first feature and the second feature, receiving a function relating the metric to a value of a process control parameter, wherein the first process parameter and the second process parameter are values of the control process parameter, and using the location specific data and the function, calculating the first process parameter and the second process parameter.

Example 24. The method of example 23, wherein the control process parameter is a subset of a process parameter set including gas cluster ion beam dose, tilt angle, twist angle, and dwell time.

Example 25. The method of example 22, wherein exposing the first feature and exposing the second feature includes: selecting a scan trajectory, the scan trajectory including the first location and the second location; moving the substrate continuously along a scan trajectory using a scanning apparatus; and changing the process along the scan trajectory by selecting the first process parameter and the second process parameter based on the location specific data.

Example 26. The method of example 25, wherein the first process parameter includes a first twist angle and the second process parameter includes a second twist angle, and wherein the difference between the first twist angle and the second twist angle is less than or equal to 180 degrees.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
   loading the substrate on a substrate holder, the substrate comprising a major surface, and a feature disposed over the major surface, the feature having a first width along an etch direction and exposing portions of the major surface; and changing the first width of the feature to a second width along the etch direction by etching a first portion of sidewalls of the feature with a ion beam oriented along a beam direction.

2. The method of claim 1, wherein the etch direction is along the orthogonal projection of the beam direction on the major surface so that the ion beam is inclined at a tilt angle with a normal to the major surface or the etch direction is parallel to the major surface and perpendicular to the sidewalls.

3. The method of claim 1,
wherein the substrate is oriented in a first orientation relative to the etch direction while changing the first width, wherein the method further comprising
rotating the substrate to a second orientation relative to the etch direction, and
changing the second width of the feature to a third width along the etch direction by etching a second portion of the sidewalls of the feature with the ion beam oriented along the beam direction.

4. The method of claim 1, further comprising:
loading the substrate on the substrate holder of a scanning apparatus; and
orienting, using the scanning apparatus, the substrate relative to the ion beam by
tilting the substrate at a selected tilt angle, the tilt angle being the angle formed by the ion beam and a line normal to the major surface; and
rotating the substrate about an axis normal to the major surface, wherein the rotation orients a reference axis in the major surface to form a selected twist angle between the reference axis and a line parallel with the etch direction.

5. The method of claim 4,
wherein the tilt angle is selected for the ion beam to impinge on a boundary between the exposed portion of the major surface and a sidewall of the feature, and
wherein the tilt angle is selected to reduce the difference between the tilt angle and a right angle.

6. The method of claim 1,
wherein the feature is within a patterned first layer that is disposed over the major surface, the major surface comprising a second layer, wherein the first layer comprises a first material, and wherein the second layer comprises a second material; and
wherein changing the width of the feature along the etch direction comprises
maintaining the substrate at a fixed orientation relative to the ion beam;
exposing a target area of the substrate to a target dose of cluster impacts by moving the substrate through the ion beam; and
removing the first material at a faster removal rate relative to the respective removal rate of the second material.

7. The method of claim 6, wherein moving the substrate through the ion beam comprises moving the substrate in the plane of the major surface.

8. The method of claim 1,
wherein the feature is an opening within a patterned first layer that is disposed over the major surface,
wherein the sidewalls of the opening form the sidewalls of the feature, wherein the width of the feature along the etch direction is a width of the opening between opposite sidewalls of the opening along the etch direction, and
wherein changing the width of the feature along a etch direction increases the width of the opening along the etch direction.

9. The method of claim 8,
wherein the feature is adjacent to a second opening within the first layer, the second opening being patterned simultaneously with the feature using a photolithography technique;
wherein, along the etch direction, a dimension of the first layer between a sidewall of the feature and the adjacent sidewall of the second opening is greater than or equal to a resolution limit of the photolithography technique; and
wherein changing the width of the feature along the etch direction reduces the dimension of the first layer along the etch direction between a sidewall of the feature and the adjacent sidewall of the second opening to be less than the resolution limit of the photolithography technique.

10. The method of claim 1,
wherein the feature is a construct within a patterned first layer that is disposed over the major surface, the first layer being patterned using a photolithography technique,
wherein the sidewalls of the construct form the sidewalls of the feature,
wherein the width of the feature along the etch direction is a width of the construct between opposing sidewalls of the construct along the etch direction, the width of the construct being greater than or equal to a resolution limit of the photolithography technique,
wherein changing the width of the feature along the etch direction reduces the width of the feature along the etch direction to less than the resolution limit of the photolithography technique.

11. The method of claim 1,
wherein the feature is within a patterned first layer that is disposed over the major surface, the first layer being a hard mask comprising spin-on carbon, or silicon oxide, or silicon nitride, or silicon anti-reflective coating, or titanium nitride, or a metal, or a metal oxide, or a combination thereof.

12. A method of processing a substrate, the method comprising:
loading the substrate on a substrate holder, the substrate comprising a major surface and a plurality of parallel lines disposed over the major surface; and
exposing the plurality of parallel lines to a ion beam oriented in a beam direction, the beam direction having an orthogonal projection onto the major surface, the orthogonal projection being oriented in an etch direction, wherein the plurality of parallel lines are parallel with the etch direction.

13. The method of claim 12, wherein the exposing causes a smoothing of the surfaces of the plurality of parallel lines.

14. The method of claim 12, wherein the exposing descums the plurality of parallel lines.

15. The method of claim 12, wherein exposing the plurality of parallel lines to a ion beam comprises:
loading the substrate on the substrate holder of a scanning apparatus; and
orienting, using the scanning apparatus, the substrate relative to the ion beam by tilting the substrate at a selected tilt angle, the tilt angle being the angle formed by the beam direction and a line normal to the major surface; and rotating the substrate about an axis normal to the major surface, wherein the rotation orients the parallel lines in the etch direction;

maintaining the substrate at a fixed orientation relative to the ion beam;

selecting a set of ion beam parameters; and moving the substrate through the ion beam with the selected set of ion beam parameters.

16. The method of claim 15, wherein the ion beam provides a target dose between $10^{11}$ $10^{-2}$ to $10^{16}$ cm$^{-2}$ and the selected tilt angle has a magnitude between 55° and 85°.

17. The method of claim 12, wherein the plurality of parallel lines comprises lines having a core structure comprising a first material and a sidewall structure comprising a second material, the second material being different from the first material.

18. A method of processing a substrate, the method comprising:

loading the substrate on a substrate holder, the substrate comprising a major surface, a first feature disposed over the major surface at a first location, and a second feature disposed over the major surface at a second location;

exposing the first feature to a first ion beam with a first process parameter; and exposing the second feature to a second ion beam with a second process parameter, the first process parameter being different from the second process parameter.

19. The method of claim 18, further comprising selecting the first process parameter and the second process parameter based on location specific data of a metric of the first feature and the second feature.

20. The method of claim 19, wherein the first process parameter and the second process parameter are selected based on:

receiving location specific data of the metric of the first feature and the second feature, receiving a function relating the metric to a value of a process control parameter, wherein the first process parameter and the second process parameter are values of the control process parameter, and using the location specific data and the function, calculating the first process parameter and the second process parameter.

21. The method of claim 20, wherein the control process parameter is a subset of a process parameter set comprising ion beam dose, tilt angle, twist angle, and dwell time.

22. The method of claim 19, wherein exposing the first feature and exposing the second feature comprises:

selecting a scan trajectory, the scan trajectory comprising the first location and the second location;

moving the substrate continuously along a scan trajectory using a scanning apparatus; and changing the process along the scan trajectory by selecting the first process parameter and the second process parameter based on the location specific data.

* * * * *

UNITED STATES PATENT AND TRADEMARK OFFICE
CERTIFICATE OF CORRECTION

PATENT NO. : 11,694,872 B2
APPLICATION NO. : 17/663811
DATED : July 4, 2023
INVENTOR(S) : Dobashi et al.

Page 1 of 1

It is certified that error appears in the above-identified patent and that said Letters Patent is hereby corrected as shown below:

In the Claims

In Column 23, in Claim 16, Line 13, delete "$10^{11}$ $10^{-2}$ to $10^{16}$ cm$^{-2}$" and insert -- $10^{11}$ cm$^{-2}$ to $10^{16}$ cm$^{-2}$, --.

Signed and Sealed this
Twenty-first Day of November, 2023

*Katherine Kelly Vidal*

Katherine Kelly Vidal
*Director of the United States Patent and Trademark Office*